(12) United States Patent
Takata

(10) Patent No.: US 10,163,993 B2
(45) Date of Patent: Dec. 25, 2018

(54) DISPLAY PANEL AND METHOD FOR MANUFACTURING SAME

(71) Applicant: JOLED INC., Tokyo (JP)

(72) Inventor: Masakazu Takata, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/471,286

(22) Filed: Mar. 28, 2017

(65) Prior Publication Data

US 2017/0287993 A1 Oct. 5, 2017

(30) Foreign Application Priority Data

Mar. 31, 2016 (JP) ................................. 2016-072150

(51) Int. Cl.
| | | |
|---|---|---|
| *H01L 27/32* | (2006.01) | |
| *H01L 51/00* | (2006.01) | |
| *H01L 51/50* | (2006.01) | |

(52) U.S. Cl.
CPC ...... *H01L 27/3246* (2013.01); *H01L 27/3211* (2013.01); *H01L 51/0005* (2013.01); *H01L 51/5056* (2013.01); *H01L 51/5072* (2013.01); *H01L 51/5088* (2013.01); *H01L 51/5092* (2013.01)

(58) Field of Classification Search
CPC ............ H01L 27/3246; H01L 27/3211; H01L 51/0005; H01L 51/5092; H01L 51/5072; H01L 51/5088; H01L 51/5056
USPC ......................................................... 257/40
See application file for complete search history.

(56) References Cited

U.S. PATENT DOCUMENTS

| | | | |
|---|---|---|---|
| 2004/0119066 A1* | 6/2004 | Han | ..................... H01L 27/3246 257/40 |
| 2009/0160322 A1* | 6/2009 | Yoshida | .............. H01L 27/3246 313/504 |
| 2013/0187131 A1* | 7/2013 | Chung | .................. H01L 27/326 257/40 |
| 2014/0306198 A1* | 10/2014 | Im | ...................... H01L 51/0013 257/40 |

(Continued)

FOREIGN PATENT DOCUMENTS

| | | |
|---|---|---|
| JP | 2001-291584 | 10/2001 |
| JP | 2010-186582 | 8/2010 |
| JP | 2013-187000 | 9/2013 |

*Primary Examiner* — Fernando L Toledo
*Assistant Examiner* — Adam S Bowen
(74) *Attorney, Agent, or Firm* — Greenblum & Bernstein, P.L.C.

(57) ABSTRACT

A display panel including a substrate; first, second, and third lower electrodes; first and second column banks; first, second, and third organic light-emitting layers; and an upper electrode. When a first ink for forming the first organic light-emitting layer, a second ink for forming the second organic light-emitting layer, and a third ink for forming the third organic light-emitting layer are applied, ink-separating capability of the first column bank for separating the first ink and the second ink is lower than ink-separating capability of the second column bank for separating the second ink and the third ink, and ink-separating capability depends on: (i) a height of the first and second column banks, or (ii) liquid repellency of the first column bank against the first ink and the second ink and liquid repellency of the second column bank against the second ink and the third ink.

14 Claims, 20 Drawing Sheets

(56) References Cited

U.S. PATENT DOCUMENTS

2016/0276615 A1* 9/2016 Kitabayashi ........ H01L 51/5036
2016/0372670 A1* 12/2016 Min .................... H01L 51/0014

* cited by examiner

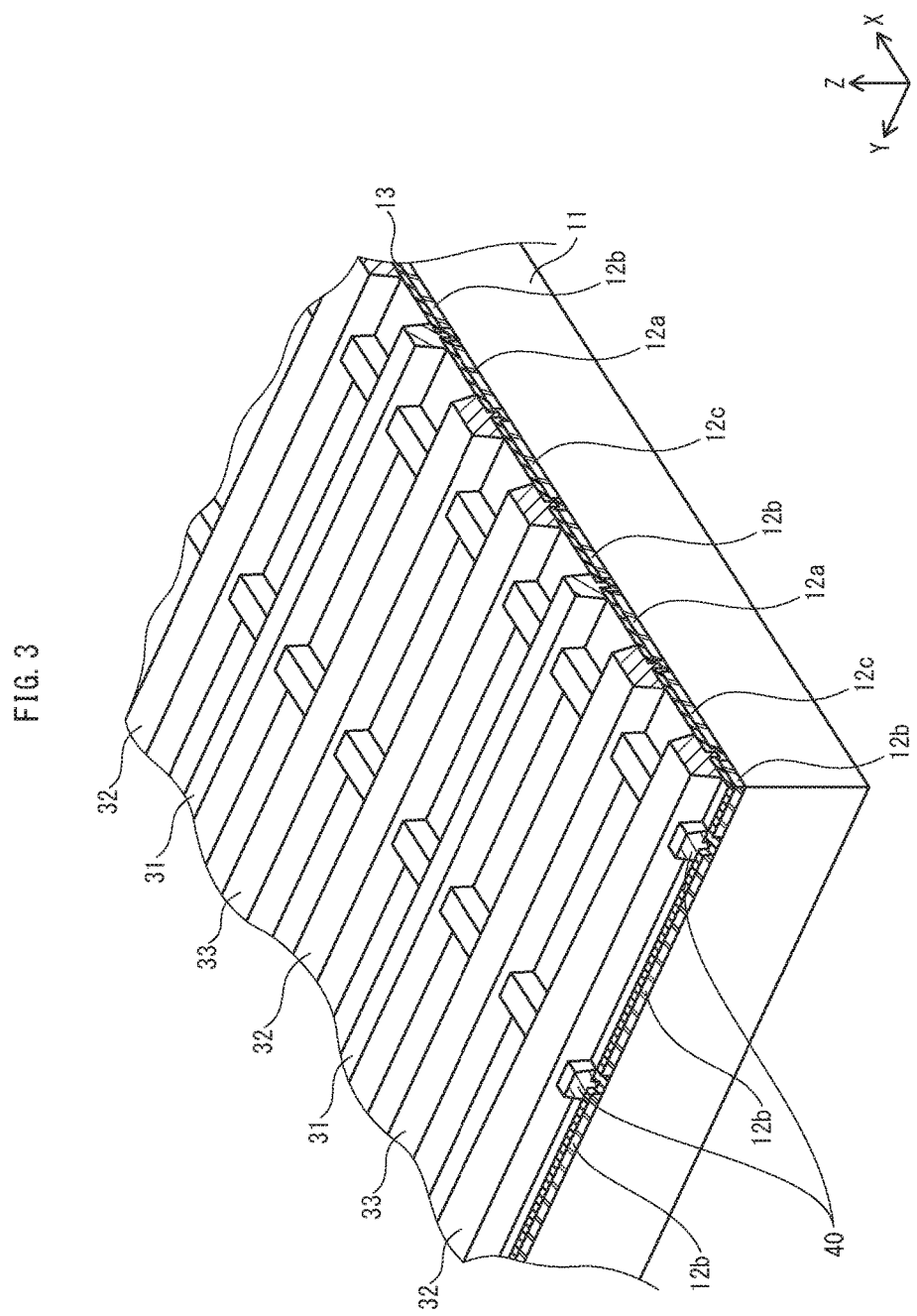

DISPLAY PANEL AND METHOD FOR MANUFACTURING SAME

This application is based on an application No. 2016-72150 filed in Japan, the contents of which are hereby incorporated by reference.

BACKGROUND OF THE DISCLOSURE (1) Technical Field

The present disclosure relates to a display panel including an organic light-emitting element such as an organic light-emitting diode (OLED).

(2) Description of Related Art

Display panels using organic light-emitting diodes are known. Such display panels include a substrate, lower electrodes disposed with gaps between each other in an X-axis direction and a Y-axis direction, organic light-emitting layers disposed on the lower electrodes, and an upper electrode that are disposed in this order, and may further include, as necessary, layers such as a hole injection layer, a hole transport layer, an electron injection layer, an electron transport layer, and a sealing layer. In such display panels, column banks extending in the Y-axis direction may be disposed in gaps between lower electrodes that are adjacent in the X-axis direction. Further, in such display panels, organic light-emitting layers that are adjacent in the X-axis direction each have a different light-emission color. For example, a red organic light-emitting layer, a green organic light-emitting layer, and a blue organic light-emitting layer may be arrayed in this order in the X-axis direction.

Japanese Patent Application Publication No. 2001-291584, for example, discloses forming organic light-emitting layers by ejecting, through an ink-jet process, solutions containing organic light-emitting materials of different light-emission colors into adjacent regions between column banks on the substrate, and then drying the solutions held in the regions. The solutions are ejected so as to land at the X-axis direction centers of the regions between the column banks. Japanese Patent Application Publication No. 2013-187000, for example, discloses that the upper surface of a solution held in a region between column banks bulges upwards out from the region between column banks.

SUMMARY OF THE DISCLOSURE (1) Problem to be Solved

In some display panels, display defect may occur due to color mixture of light-emitting materials occurring on column banks. Such color mixture may be prevented by forming the column banks with a great width, but a ratio of the surface area of the display panel occupied by the organic light-emitting layers relative to the entire surface area of the display panel may decrease with wide column banks. Further, the smaller the thicknesses of the light-emitting layers are, the greater the differences in thicknesses of the light-emitting layers may be.

The present disclosure aims, on the basis of the above problems, to prevent display defect caused by color mixture, decrease in opening ratio, a small organic light-emitting layer thickness, and a difference in organic light-emitting layer thickness.

(2) Means for Solving Problem

In order to solve the above problems, a method of manufacturing a display panel pertaining to another aspect of the present disclosure includes: preparing a substrate; forming, on the substrate, a first lower electrode, a second lower electrode, and a third lower electrode that are spaced away from one another in a first direction; forming a first column bank between the first lower electrode and the second lower electrode, and a second column bank between the second lower electrode and the third lower electrode; applying a first ink containing a first organic light-emitting material above the first lower electrode, a second ink containing a second organic light-emitting material above the second lower electrode, and a third ink containing a third organic light-emitting material above the third lower electrode; forming a first organic light-emitting layer by drying the first ink, forming a second organic light-emitting layer by drying the second ink, and forming a third organic light-emitting layer by drying the third ink; and forming an upper electrode covering the first organic light-emitting layer, the second organic light-emitting layer, the third organic light-emitting layer, the first column bank, and the second column bank. In the method, the second organic light-emitting material has the same light-emission color as the light-emission color of the first organic light-emitting material, and the third organic light-emitting material has a light-emission color that is different from the light-emission color of the first organic light-emitting material.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

FIG. 3 is a partially-cutout perspective view illustrating shapes of column banks and row banks in the display panel of FIG. 1.

FIG. 4A is a partially-cutout perspective view illustrating how a bank material film is formed on a hole injection layer, and FIG. 4B is a partially-cutout perspective view illustrating how the row banks are formed.

FIG. 5A is a partially-cutout perspective view illustrating how a bank material film is formed on the hole injection layer and the row banks, and FIG. 5B is a partially-cutout perspective view illustrating how the column banks are formed.

FIG. 6A is a cross-sectional view illustrating a state immediately after application of inks, FIG. 6B is a cross-sectional view illustrating a state in which inks have come in contact with each other on first column banks, and FIG. 6C is a cross-sectional view illustrating a state after forming of organic light-emitting layers.

FIG. 7A is a cross-sectional view illustrating a state immediately after application of an ink, and FIG. 7B is a cross-sectional view illustrating a state after forming of organic light-emitting layers.

FIG. 8A is a cross-sectional view of the display panel of FIG. 1, and FIG. 8B is a cross-sectional view of a display panel pertaining to a comparative example.

FIG. 11A is a cross-sectional view illustrating a state in which inks have come in contact with each other on first column banks, and FIG. 11B is a cross-sectional view illustrating a state after forming of the organic light-emitting layers.

DESCRIPTION OF EMBODIMENTS

Figure 1:
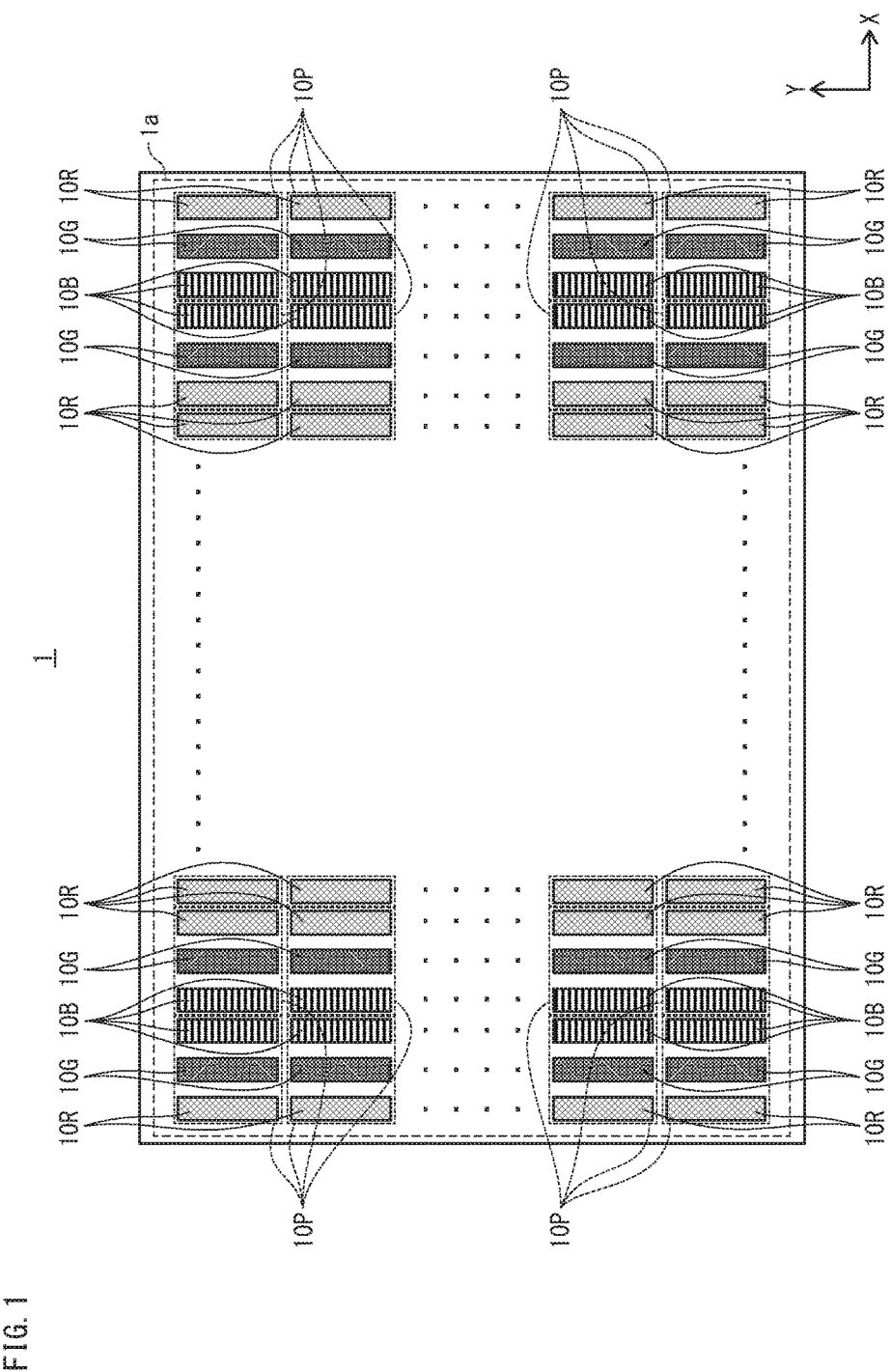
FIG. 1 illustrates an arrangement of organic light-emitting elements in a display panel pertaining to Embodiment 1 of the present disclosure.

Circumstances Leading to Aspects of Present Disclosure

There is a demand for display panels with improved device performances, and problems described in the following need to be solved in order to achieve such display panels.

The first problem is display defect caused by color mixture. Specifically, even if a solution is ejected so as to land at the center in the X-axis direction of a region between two column banks during the forming of a light-emitting layer, the solution may accidentally land near one of the column banks. In such a case, a shift of a volume of the solution toward the one of the column banks may occur and the solution may spread onto the one of the column banks to a great extent. This may result in solutions each including an organic light-emitting material of a different light-emission color contacting each other on a column bank and mixing with each other. Such a situation is hereinafter referred to as color mixture. Color mixture may also occur when subpixels of three colors, namely red (R), green (G), and blue (B), that form a pixel are simultaneously formed through an ink jet process. Specifically, a first solution may accidentally spread onto a column bank and a droplet of a second solution of a different light-emission color, which is supposed to land in a region adjacent to the region holding the first solution, may land at a position shifted from the center of the adjacent region. In this situation, the first solution and the second solution may contact each other and cause color mixture. As described above, color mixture occurs when solutions each including an organic light-emitting material of a different light-emission color mix. Occurrence of such color mixture causes display defect; that is, the consequently-formed organic light-emitting layers do not emit light of desired colors.

The second problem is a decrease in opening ratio. The term "opening ratio" refers to the ratio of the surface area of the display panel occupied by the organic light-emitting layers relative to the entire surface area of the display panel. Forming wide column banks in order to prevent color mixture described above results in a decrease in opening ratio. Any display panel needs to have the number of pixels determined by the standard that the display panel adopts. Thus, when column banks having great widths are formed in order to prevent color mixture, the width of the regions between the column banks decreases. In such cases, the surface area occupied by the organic light-emitting layers also decreases.

The third problem is a difference in organic light-emitting layer thickness. When forming organic light-emitting layers, a predetermined amount of solution is ejected into each region between column banks in accordance with the design thicknesses of the organic light-emitting layers. However, the amount of solution that is ejected may accidentally vary among different ones of the regions, and consequently the amount of the solution per unit area may vary. Such a difference in solution application amount per unit area gives rise to a difference in organic light-emitting layer thickness.

The fourth problem is the difficulty in forming organic light-emitting layers with a sufficient thickness. When a great number of pixels are formed per unit area so as to improve display panel image quality, each subpixel has a small size and regions between banks are small. The smaller the regions between banks are, the more likely the solutions applied to the regions are to flow out of the banks even with the solutions slightly bulging out from the regions between the banks. This makes it difficult to apply the solutions so as to bulge out from the regions to a great extent. That is, the surfaces of the solutions applied to the regions have a low height, and consequently only a small amount of solution can be applied per unit area. As a result, the organic light-emitting layers obtained through drying the solutions have small thicknesses, and it becomes difficult to obtain organic light-emitting layers with a sufficient thickness.

As described above, there is an increasing demand for achieving display panels with improved device performances by solving problems such as the ones described above, i.e. preventing display defect caused by color mixture, a decrease in opening ratio, a difference in organic light-emitting layer thickness, and obtaining the organic light-emitting layers with a sufficient thickness.

Overview of Aspects of Present Disclosure

A display panel pertaining to one aspect of the present disclosure includes: a substrate; a first lower electrode, a second lower electrode, and a third lower electrode that are disposed on the substrate and are spaced away from one another in a first direction; a first column bank disposed above the substrate and between the first lower electrode and the second lower electrode, and extending in a second direction intersecting the first direction; a second column bank disposed above the substrate and between the second lower electrode, and the third lower electrode and extending in the second direction; a first organic light-emitting layer disposed above the first lower electrode, a second organic light-emitting layer disposed above the second lower electrode, and a third organic light-emitting layer disposed above the third lower electrode; and an upper electrode disposed above the first organic light-emitting layer, the second organic light-emitting layer, the third organic light-emitting layer, the first column bank, and the second column bank. In the display panel, the first organic light-emitting layer contains a first organic light-emitting material, the second organic light-emitting layer contains a second organic light-emitting material that has the same light-emission color as the first organic light-emitting material, the third organic light-emitting layer contains a third organic light-emitting material that has a light-emission color that is different from the first organic light-emitting material, ink-separating capability of the first column bank for separating a first ink and a second ink is lower than ink-separating capability of the second column bank for separating the second ink and a third ink, the first ink containing the first organic light-emitting material and applied above the first lower electrode to form the first organic light-emitting layer, the second ink containing the second organic light-emitting material and applied above the second lower electrode to form the second organic light-emitting layer, and the third ink containing the third organic light-emitting material and applied above the third lower electrode to form the third organic light-emitting layer, and the first column bank has a lower height than the second column bank.

According to the display panel pertaining to one aspect of the present disclosure, the ink-separating capability of the first column bank is lower than the ink-separating capability of the second column bank.

In other words, when the first ink, the second ink, and the third ink are applied, the possibility of the second ink and the third ink spreading onto the second column bank is lower than the possibility of the first ink and the second ink spreading onto the first column bank. That is, the possibility that the second ink and the third ink contact each other is lower than the possibility that the first ink and the second ink contact each other. Here, the second organic light-emitting material in the second ink and the third organic light-emitting material in the third ink each have a different light-emission color. Contact of the second ink and the third ink thus causes color mixture. Meanwhile, the first organic light-emitting material in the first ink and the second organic light-emitting material in the second ink have the same light-emission color. Contact of the first ink and the second ink thus does not cause color mixture. Accordingly, this structure prevents occurrence of color mixture in the entire display panel.

Further, even when an amount of the first ink and an amount of the second ink at regions sandwiching the first column bank accidentally differ from each other, the first ink and the second ink are likely to spread onto the first column bank and contact each other. This prevents thicknesses of the first organic light-emitting layer and the second organic light-emitting layer that are consequently formed from differing from each other.

Because the first column bank has a lower height than the second column bank, the first ink and the second ink that are applied to the regions sandwiching the first column bank are likely to spread onto the first column bank and contact each other. In other words, the ink-separating capability of the first column bank is lower than the ink-separating capability of the second column bank. Adjustment of ink-separating capability is achieved by changing heights of the column banks, without increasing the widths of the column banks. Accordingly, even when the display panel does not have a small opening ratio, occurrence of color mixture is prevented and thicknesses of organic light-emitting layers are prevented from differing from one another.

A display panel pertaining to one aspect of the present disclosure includes: a substrate; a first lower electrode, a second lower electrode, and a third lower electrode that are disposed on the substrate and are spaced away from one another in a first direction; a first column bank disposed above the substrate and between the first lower electrode and the second lower electrode, and extending in a second direction intersecting the first direction; a second column bank disposed above the substrate and between the second lower electrode, and the third lower electrode and extending in the second direction; a first organic light-emitting layer disposed above the first lower electrode, a second organic light-emitting layer disposed above the second lower electrode, and a third organic light-emitting layer disposed above the third lower electrode; and an upper electrode disposed above the first organic light-emitting layer, the second organic light-emitting layer, the third organic light-emitting layer, the first column bank, and the second column bank. In the display panel, the first organic light-emitting layer contains a first organic light-emitting material, the second organic light-emitting layer contains a second organic light-emitting material that has the same light-emission color as the first organic light-emitting material, the third organic light-emitting layer contains a third organic light-emitting material that has a light-emission color that is different from the first organic light-emitting material, ink-separating capability of the first column bank for separating a first ink and a second ink is lower than ink-separating capability of the second column bank for separating the second ink and a third ink, the first ink containing the first organic light-emitting material and applied above the first lower electrode to form the first organic light-emitting layer, the second ink containing the second organic light-emitting material and applied above the second lower electrode to form the second organic light-emitting layer, and the third ink containing the third organic light-emitting material and applied above the third lower electrode to form the third organic light-emitting layer, and liquid repellency of the first column bank against the first ink and the second ink is lower than liquid repellency of the second column bank against the second ink and the third ink.

Because the first column bank has lower liquid repellency than the second column bank, the first ink and the second ink that are applied to the regions sandwiching the first column bank are likely to spread onto the first column bank and contact each other. In other words, the ink-separating capability of the first column bank is lower than the ink-separating capability of the second column bank. Adjustment of ink-separating capability is achieved by changing liquid repellency of the column banks, without increasing the widths of the column banks. Accordingly, even when the display panel does not have a small opening ratio, occurrence of color mixture is prevented and thicknesses of organic light-emitting layers are prevented from differing from one another.

In a specific aspect of the display panel pertaining to one aspect of the present disclosure, the first organic light-emitting layer and the second organic light-emitting layer may each extend onto the first column bank and may be in contact with each other.

This structure indicates that the first ink and the second ink that have been applied extend onto the first column bank and are in contact with each other. This structure prevents thicknesses of the first organic light-emitting layer and the second organic light-emitting layer from differing from each other.

In a specific aspect of the display panel pertaining to one aspect of the present disclosure, a thickness of the first organic light-emitting layer and a thickness of the second organic light-emitting layer may be greater than a thickness of the third organic light-emitting layer.

Because of this, the first organic light-emitting layer and the second organic light-emitting layer are provided with sufficient thicknesses.

In a specific aspect of the display panel pertaining to one aspect of the present disclosure, at least one of the first organic light-emitting layer, the second light-emitting layer, and the third organic light-emitting layer may have a width in the first direction that differs from widths in the first direction of the rest of the first organic light-emitting layer, the second light-emitting layer, and the third organic light-emitting layer.

This enables adjustment of widths of the organic light-emitting layers in the first direction in accordance with a factor such as luminance of the organic light-emitting layers.

In a specific aspect of the display panel pertaining to one aspect of the present disclosure, an organic light-emitting layer that has the shortest luminance half-life among the first organic light-emitting layer, the second organic light-emitting layer, and the third organic light-emitting layer may have the greatest width in the first direction among the first organic light-emitting layer, the second organic light-emitting layer, and the third organic light-emitting layer.

This structure prevents luminance unevenness because organic light-emitting layers which have a short luminance half-life and whose luminance is likely to deteriorate relatively early occupy a large surface area.

In a specific aspect of the display panel pertaining to one aspect of the present disclosure, an organic light-emitting layer that has the longest luminance half-life among the first organic light-emitting layer, the second organic light-emitting layer, and the third organic light-emitting layer may have the smallest width in the first direction among the first organic light-emitting layer, the second organic light-emitting layer, and the third organic light-emitting layer.

This structure prevents luminance unevenness because organic light-emitting layers which have a long luminance half-life and whose luminance is not likely to deteriorate occupy a small surface area.

A method of manufacturing a display panel pertaining to one aspect of the present disclosure a method of manufacturing a display panel pertaining to another aspect of the present disclosure includes: preparing a substrate; forming, on the substrate, a first lower electrode, a second lower electrode, and a third lower electrode that are spaced away from one another in a first direction; forming a first column bank between the first lower electrode and the second lower electrode, and a second column bank between the second lower electrode and the third lower electrode; applying a first ink containing a first organic light-emitting material above the first lower electrode, a second ink containing a second organic light-emitting material above the second lower electrode, and a third ink containing a third organic light-emitting material above the third lower electrode; forming a first organic light-emitting layer by drying the first ink, forming a second organic light-emitting layer by drying the second ink, and forming a third organic light-emitting layer by drying the third ink; and forming an upper electrode covering the first organic light-emitting layer, the second organic light-emitting layer, the third organic light-emitting layer, the first column bank, and the second column bank. In the method, the second organic light-emitting material has the same light-emission color as the light-emission color of the first organic light-emitting material, and the third organic light-emitting material has a light-emission color that is different from the light-emission color of the first organic light-emitting material.

In this structure, the first organic light-emitting material included in the first ink and the second organic light-emitting material included in the second ink have the same light-emission color. Accordingly, occurrence of color mixture is prevented even when the first ink and the second ink, applied through an ink-jet process, do not land at desired positions.

A specific aspect of the method pertaining to one aspect of the present disclosure further includes, when applying the first ink, the second ink, and the third ink, the first ink and the second ink may each spread onto the first column bank and may contact each other.

Because the first ink and the second ink have the same light-emission color, color mixture does not occur even when the first ink and the second ink contact each other. Accordingly, even when the application amount of the first ink and the application amount of the second ink accidentally differ from each other, the thickness of the first organic light-emitting layer and the thickness of the second light-emitting layer are prevented from differing from each other without causing color mixture.

In a specific aspect of the method pertaining to one aspect of the present disclosure, a height of the first column bank may be lower than a height of the second column bank.

Because the first column bank has a lower height than the second column bank, the first ink and the second ink that are applied to the regions sandwiching the first column bank are likely to spread onto the first column bank and contact each other. In other words, the ink-separating capability of the first column bank is lower than the ink-separating capability of the second column bank. Adjustment of ink-separating capability thus is achieved by changing heights of the column banks, without increasing the widths of the column banks. Accordingly, even when the display panel does not have a small opening ratio, occurrence of color mixture is prevented and thicknesses of organic light-emitting layers are prevented from differing from one another.

In a specific aspect of the method pertaining to one aspect of the present disclosure, liquid repellency of the first column bank against the first ink and the second ink may be lower than liquid repellency of the second column bank against the second ink and the third ink.

Because the first column bank has lower liquid repellency than the second column bank, the first ink and the second ink that are applied to the regions sandwiching the first column bank are likely to spread onto the first column bank and contact each other. In other words, the ink-separating capability of the first column bank is lower than the ink-separating capability of the second column bank. Adjustment of ink-separating capability is achieved by changing liquid repellency of the column banks, without increasing the widths of the column banks. Accordingly, even when the display panel does not have a small opening ratio, occurrence of color mixture is prevented and thicknesses of organic light-emitting layers are prevented from differing from one another.

In a specific aspect of the method pertaining to one aspect of the present disclosure, a width of the first column bank in the first direction may be smaller than a width of the second column bank in the first direction.

Forming the first column bank with a small width achieves a great opening ratio. Further, because the first column bank has a smaller width than the second column bank, the first ink and the second ink that are applied to the regions sandwiching the first column bank are likely to spread onto the first column bank and contact each other. In other words, the ink-separating capability of the first column bank is lower than the ink-separating capability of the second column bank. Accordingly, adjusting ink-separating capability by changing widths of the column banks prevents occurrence of color mixture and prevent thicknesses of organic light-emitting layers from differing from one another.

Further, recently, subpixels are formed in a small size in order to display high-quality images. When the subpixels have a small size, regions between the banks also are small. In such a structure, a solution applied to a region is likely to flow out onto the banks even with the solutions slightly bulging out from the region between the banks. Consequently, it is difficult to apply the solution so as to bulge out to a great extent. When the height of the surface of the solution after application is low, an amount of the solution that can be applied per unit area also is small. In such a structure, the organic light-emitting layers, which are obtained by drying the solution, have small thicknesses, and it is difficult to form organic light-emitting layers with sufficient thicknesses.

Meanwhile, in the specific aspect of the method described above, the solutions for forming the first organic light-emitting layer, the second organic light-emitting layer, and the third organic light-emitting layer are applied to large areas because the first column bank has a smaller width than the second column bank. This enables the solutions to be applied so as to bulge out from the regions between the banks to a great extent. As a result, a large amount of solution is applied per unit area.

Further, because the first column bank has a smaller width than the second column bank, the solutions that are applied at different sides of the first column bank are likely to spread onto the first column bank and contact each other. In the specific aspect of the method of manufacturing the display panel described above, the first ink containing the first organic light-emitting material, which is applied at one side of the first column bank, and the second ink containing the second organic light-emitting material, which is applied at the other side of the first column bank, have the same light-emission color. Color mixture thus does not occur even when the first ink and the second ink contact each other. Accordingly, when the first ink and the second ink applied at different sides of the first column bank spread onto the first column bank and contact each other on the first column bank, applied ink spans two regions corresponding to two subpixels, bulging out even more greatly. This enables application of a very large amount of ink per unit area.

Because of this, the first organic light-emitting layer, the second organic light-emitting layer, and the third organic light-emitting layer are easily provided with sufficient thicknesses even when the subpixels have a small size.

In a specific aspect of the method pertaining to one aspect of the present disclosure, a volume of the third ink applied per unit area may be smaller than a volume of the first ink applied per unit area and a volume of the second ink applied per unit area.

By applying a large volume of ink containing an organic light-emitting material per unit area, the organic light-emitting layers are provided with sufficient thicknesses even when the subpixels have a small size.

In a specific aspect of the method pertaining to one aspect of the present disclosure, viscosity of the third ink may be higher than viscosity of the first ink and viscosity of the second ink.

In cases where an application amount of the ink containing an organic light-emitting material is the same, the lower the viscosity of the ink, the more greatly the ink spreads onto the column bank. When an ink with relatively high viscosity is adopted as the third ink, the third ink spreads onto the second column bank only to a small extent. As a result, the third ink is not likely to contact the second ink adjacent to the third ink, and occurrence of color mixture is prevented.

In a specific aspect of the method pertaining to one aspect of the present disclosure, applying of the first ink, the second ink, and the third ink may be performed through ejecting the first ink, the second ink, and the third ink from an ink-jet device, and upon ejection from the ink-jet device, a ligament of the third ink may be shorter than a ligament of the first ink and a ligament of the second ink.

The longer the ligament of an ink containing an organic light-emitting material is, the more likely the ink is to land at a position other than a desired position. When an ink with a relatively short ligament is adopted as the third ink, the possibility that a droplet of the third ink lands at a position other than the desired position is relatively small. As a result, the possibility that the droplet of the third ink spreads onto the second column bank and contacts the second ink adjacent to the third ink is relatively small. This prevents occurrence of color mixture.

The following describes embodiments pertaining to the present disclosure in detail, with reference to the drawings. In the following description, the X-axis direction in the drawings corresponds to the first direction, and the Y-axis direction in the drawings corresponds to the second direction.

Embodiment 1

1. Structure of Display Panel 1
<Arrangement of Organic Light-Emitting Elements>

FIG. 1 illustrates an arrangement of organic light-emitting elements in a display panel 1.

The display panel 1 has a display region 1a in which an image is displayed. For example, red organic light-emitting elements 10R emitting red (R) light, green organic light-emitting elements 10G emitting green (G) light, and blue organic light-emitting elements 10B emitting blue (B) light are arrayed in the display region 1a in the X-axis direction and the Y-axis direction. The red organic light-emitting elements 10R, the green organic light-emitting elements 10G, and the blue organic light-emitting elements 10B (whenever it is unnecessary to distinguish the red organic light-emitting elements 10R, the green organic light-emitting elements 10G, and the blue organic light-emitting elements 10B from one another, the term "organic light-emitting elements 10" is hereinafter used) are disposed so as to correspond one-to-one with subpixels. For example, each of the organic light-emitting elements 10 has a rectangular shape.

Sets of organic light-emitting elements are repeatedly arrayed in a positive direction along the X-axis. Each of the organic light-emitting element sets includes a red organic light-emitting element 10R, a green organic light-emitting element 10G, a blue organic light-emitting element 10B, a blue organic light-emitting element 10B, a green organic light-emitting element 10G, and a red organic light-emitting element 10R that are arrayed in this order in a positive direction along the X-axis. A red organic light-emitting element 10R, a green organic light-emitting element 10G, and a blue organic light-emitting element 10B that are adjacent in the X-axis direction form a pixel 10P. For example, when the display panel 1 is of the Full High Definition standard, 1920 pixels in the X-axis direction and 1080 pixels in the Y-axis direction are arrayed in a matrix in the display panel 1. Organic light-emitting elements 10 that are adjacent in the Y-axis direction have the same light-emission color.

<Cross-Sectional Structure of Display Panel 1>

Figure 2:
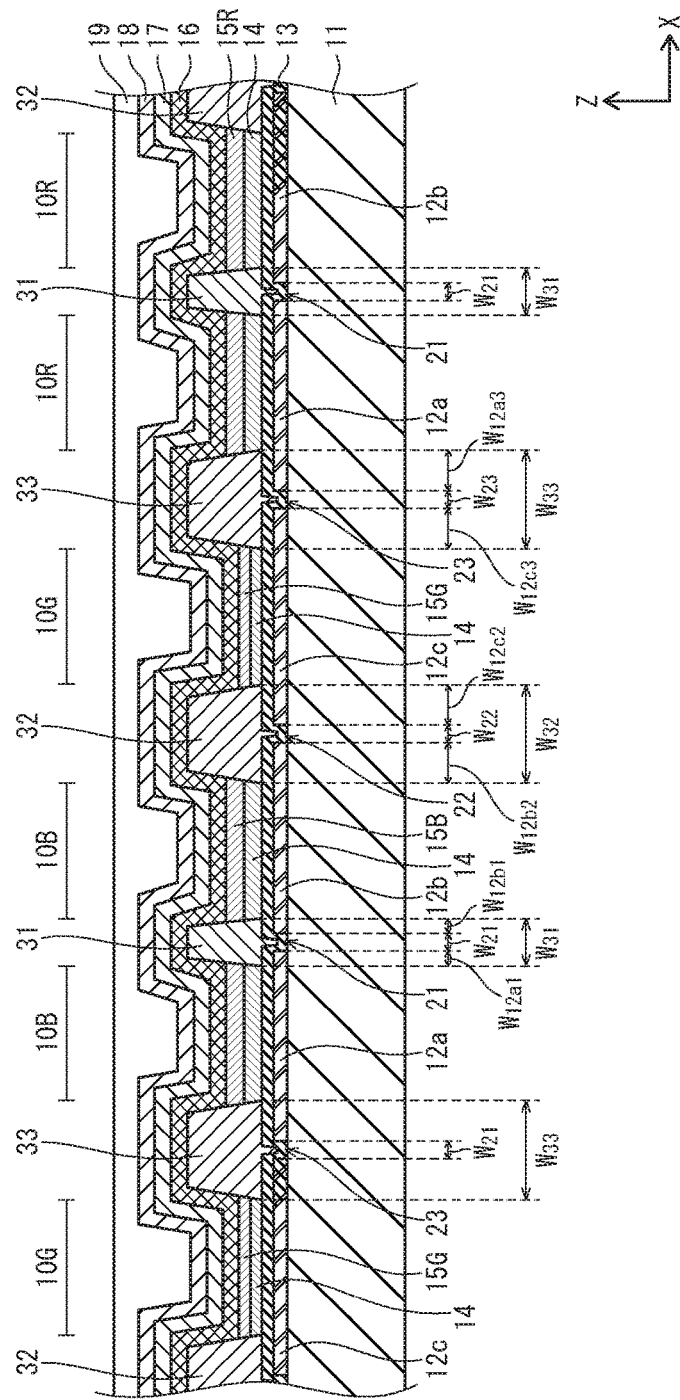
FIG. 2 is a schematic cross-sectional view of the display panel of FIG. 1, taken in an X-axis direction.

Next, a cross-sectional structure of the display panel 1 is described, with reference to a schematic cross-sectional view in FIG. 2. FIG. 2 is a cross-sectional view of the display panel 1, and mainly illustrates two pixels that are adjacent in the X-axis direction.

The display panel 1 includes: a substrate 11; first lower electrodes 12a, second lower electrodes 12b, and third lower electrodes 12c (whenever it is unnecessary to distinguish the first lower electrodes 12a, the second lower electrodes 12b, and the third lower electrodes 12c from one another, the term "lower electrodes 12" is hereinafter used); a hole injection layer 13; hole transport layers 14; red organic light-emitting layers 15R, green organic light-emitting layers 15G, and blue organic light-emitting layers 15B (whenever it is unnecessary to distinguish the red organic light-emitting layers 15R, the green organic light-emitting layers 15G, and the blue organic light-emitting layers 15B from one another, the term "organic light-emitting layers 15" is hereinafter used); an electron transport layer 16; an electron injection layer 17; an upper electrode 18; a sealing layer 19; and first column banks 31, second column banks 32, and third column banks 33 (whenever it is unnecessary to distinguish the first column banks 31, the second column banks 32, and the third column banks 33 from one another, the term "column banks 30" is hereinafter used). Although not illustrated in the cross-sectional view in FIG. 2, the display panel 1 further includes row banks 40. Each of the organic light-emitting elements 10 includes layers from a lower electrode 12 to the upper electrode 18. The display panel 1 in the present embodiment is a top-emission type display panel, and emits light upwards in the Z-axis direction in FIG. 2. The following describes components of the display panel 1.

2. Components of Display Panel 1

<Substrate>

For example, the substrate 11 includes a TFT layer and an interlayer electrically-insulating layer that are disposed on a glass substrate in this order. For example, soda-lime glass or alkali-free glass can be used as a material for the glass substrate. The TFT layer includes a plurality of transistor element units in each of the subpixels. Each of the transistor element units includes a semiconductor layer, a passivation film, and the following three electrodes: a gate, a source, and a drain. For example, polyimide, polyamide, or an acrylic resin can be used as a material for the interlayer electrically-insulating layer.

<Lower Electrodes>

The lower electrodes 12 are electrically connected to the TFT layer in the substrate 11, and function as anodes. The lower electrodes 12 are disposed with gaps between each other in the X-axis direction and with gaps between each other in the Y-axis direction. Lower electrode sets each including a first lower electrode 12a, a second lower electrode 12b, and a third lower electrode 12c are repeatedly arrayed in the X-axis direction. Each of the lower electrodes 12 has a rectangular shape. Ends of the lower electrodes 12 in the X-axis direction are covered by the column banks 30.

The lower electrodes 12 have the same width as one another. In the present disclosure, the term "width" hereinafter refers to a length in the X-axis direction. When denoting the width of a gap 21 between a first lower electrode 12a and a second lower electrode 12b that are adjacent to each other in the X-axis direction as $W_{21}$, a width of a gap 22 between a second lower electrode 12b and a third lower electrode 12c that are adjacent to each other in the X-axis direction as $W_{22}$, and a width of a gap 23 between a first lower electrode 12a and a third lower electrode 12c that are adjacent to each other in the X-axis direction as $W_{23}$, the widths $W_{21}$, $W_{22}$, and $W_{23}$ are the same as one another. The gaps between lower electrodes 12 that are adjacent to each other in the Y-axis direction have the same length in the Y-axis direction. A width $W_{12a1}$ and a width $W_{12b1}$ of portions of lower electrodes 12 covered by first column banks 31 are smaller than a width $W_{12b2}$ and a width $W_{12c2}$ of portions of lower electrodes covered by second column banks 32 and a width $W_{12c3}$ and a width $W_{12a1}$ of portions of lower electrodes 12 covered by third column banks 33. Accordingly, a width $W_{31}$ of a first column bank 31 is smaller than a width $W_{32}$ of a second column bank 32 and a width $W_{33}$ of a third column bank 33. Widths of portions of the lower electrodes 12 that are not covered by the column banks 30 correspond to widths of the organic light-emitting elements 10. Meanwhile, ends of the lower electrodes 12 in the Y-axis direction are covered by the row banks 40.

For example, a metal material containing silver (Ag) or aluminum (Al) can be used as a material for the lower electrodes 12. Because the display panel 1 is a top-emission type display panel, it is preferable that surfaces of the lower electrodes 12 have high light reflectivity. For example, a thickness of the lower electrodes 12 is 100 nm or more and 1000 nm or less.

<Hole Injection Layer>

The hole injection layer 13 is disposed on the lower electrodes 12 and portions of the substrate 11 corresponding to the gaps between adjacent lower electrodes 12. The hole injection layer 13 has a function of improving hole injection from the lower electrodes 12 to the organic light-emitting layers 15. For example, an inorganic material such as a metal oxide can be used as a material for the hole injection layer 13. For example, an oxide of a metal such as silver (Ag), molybdenum (Mo), chromium (Cr), vanadium (V), tungsten (W), nickel (Ni), or iridium (Ir) can be used as such a metal oxide. For example, a thickness of the hole injection layer 13 is 5 nm or more and 100 nm or less.

<Hole Transport Layers>

The hole transport layers 14 are disposed on the hole injection layer 13. The hole transport layers 14 have a function of transporting holes injected from the lower electrode 12 to the organic light-emitting layers 15. The hole transport layers 14 are made of an organic material. For example, a high-molecular compound such as polyfluorene, a polyfluorene derivative, polyallylamine, or a polyallylamine derivative can be used as such an organic material. For example, a thickness of the hole transport layers 14 is 5 nm or more and 50 nm or less.

<Organic Light-Emitting Layers>

The organic light-emitting layers 15 are disposed on the hole transport layers 14. The organic light-emitting layers 15 are separated from one another by the column banks 30. Although not illustrated, organic light-emitting layers 15 that are adjacent in the Y-axis direction extend onto the row banks 40, and are in contact with one another. The organic light-emitting layers 15 have a function of emitting light due to excitons generated through recombination of holes and electrons injected into the organic light-emitting layers 15. The red organic light-emitting layers 15R contain a red organic light-emitting material. Likewise, the green organic light-emitting layers 15G contain a green light-emitting material, and the blue organic light-emitting layers 15B contain a blue light-emitting material. A high-molecular organic material such as polyfluorene, polyphenylene vinylene, polyacetylene, polyphenylene, or poly(para-phenylene) ethylene can be used as such an organic light-emitting material. The red organic light-emitting layers 15R and the blue organic light-emitting layers 15B have a greater thickness than the green organic light-emitting layers 15G. For example, the thickness of the organic light-emitting layers 15 is 30 nm or more and 200 nm or less.

<Electron Transport Layer>

The electron transport layer 16 is disposed over the entire display panel 1, covering surfaces of the organic light-emitting layers 15, the column banks 30, and the row banks 40. The electron transport layer 16 has a function of transporting electrons injected from the upper electrode 18 to the organic light-emitting layers 15. For example, an oxadiazole derivative (OXD), a triazole derivative (TAZ), a phenanthroline derivative (BCP, Bphen), or the like can be used as a material for the electron transport layer 16. For example, a thickness of the electron transport layer 16 is 5 nm or more and 50 nm or less.

<Electron Injection Layer>

The electron injection layer 17 is disposed on the electron transport layer 16. The electron injection layer 17 has a function of improving electron injection from the upper electrode 18 to the organic light-emitting layers 15. For example, a metal complex including an alkali metal can be used as a material for the electron injection layer. For example, a thickness of the electron injection layer 17 is 5 nm or more and 50 nm or less.

<Upper Electrode>

The upper electrode 18 is disposed above the column banks 30 and on the electron transport layer 16. Although not illustrated, the upper electrode 18 is also disposed above the row banks 40. The upper electrode 18 functions as a cathode. For example, indium tin oxide (ITO), indium zinc oxide (IZO), or the like can be used as a material for the upper electrode 18. Because the display panel 1 is a top-emission type display panel, it is preferable that the upper electrode 18 be made of a light-transmissive material. For example, a thickness of the upper electrode 18 is 50 nm or more and 500 nm or less.

<Sealing Layer>

The sealing layer 19 is disposed on the upper electrode 18. The sealing layer 19 has a function of preventing the layers from the lower electrodes 12 to the upper electrode 18 from being exposed to moisture and air. For example, silicon nitride (SiN) or the like can be used as a material for the sealing layer 19.

<Banks>

The column banks 30 are disposed on the hole injection layer 13 and, as described above, cover the gaps between lower electrodes 12 that are adjacent in the X-axis direction and the ends of the lower electrodes 12 in the X-axis direction. The column banks 30 have the same height as one another, such as 1 μm or more and 2 μm or less. Here, the height of the column banks 30 refers to a height from an upper surface of the substrate 11 to upper surfaces of the column banks 30. Here, a height of the row banks 40 refers to a height from the upper surface of the substrate 11 to upper surfaces of the row banks 40. All of the column banks 30 have liquid repellency. For example, photoresist containing fluorine can be used as a material for the column banks 30. An example of photoresist containing fluorine is a material containing ammonium salt of perfluorooctanoic acid (PFOA).

The width $W_{31}$ of the first column banks 31 is smaller than the width $W_{32}$ of the second column banks 32 and the width $W_{33}$ of the third column banks 33. For example, the width $W_{31}$ of the first column banks 31 is 5 μm or more and 15 μm or less. For example, the width $W_{32}$ of the second column banks 32 and the width $W_{33}$ of the third column banks 33 are 10 μm or more and 30 μm or less. That is, the width $W_{31}$ of the first column banks 31 is about 50% of the width $W_{32}$ of the second column banks 32 and the width $W_{33}$ of the third column banks 33.

As illustrated in FIG. 3, the row banks 40 are disposed on the hole injection layer 13, and as described above, cover the gaps between lower electrodes 12 that are adjacent in the Y-axis direction and the ends of the lower electrodes 12 in the Y-axis direction. Layers above the column banks 30 and the row banks 40 are not illustrated in FIG. 3 for the sake of clarity. A plurality of sets each including first lower electrodes 12a, second lower electrodes 12b, and third lower electrodes 12c are arrayed in the Y-axis direction with gaps between each other, and a row bank 40 is sandwiched between each pair of adjacent ones of these sets. The height of the row banks 40 is such that inks including organic light-emitting materials and applied to regions that are adjacent to each other in the Y-axis direction contact each other on a row bank 40 during forming of the organic light-emitting layers. The forming of the organic light-emitting layers is described later. For example, the height of the row banks 40 is 0.3 μm or more and 1 μm or less. The row banks 40 have relatively low liquid repellency. Hydrophilic photoresist can be used as a material for the row banks 40. Alternatively, an inorganic material can be used as a material for the row banks 40. Examples of such an inorganic material are silicon oxide, silicon nitride, and silicon oxynitride.

3. Method of Manufacturing Display Panel 1

The characteristics of the present embodiment reside in the structure of the column banks. The following describes a method of manufacturing the display panel 1, with a specific focus on how the row banks and the column banks are formed, with reference to partially-cutout perspective views in FIG. 4A, FIG. 4B, FIG. 5A, and FIG. 5B.

Figure 4A:
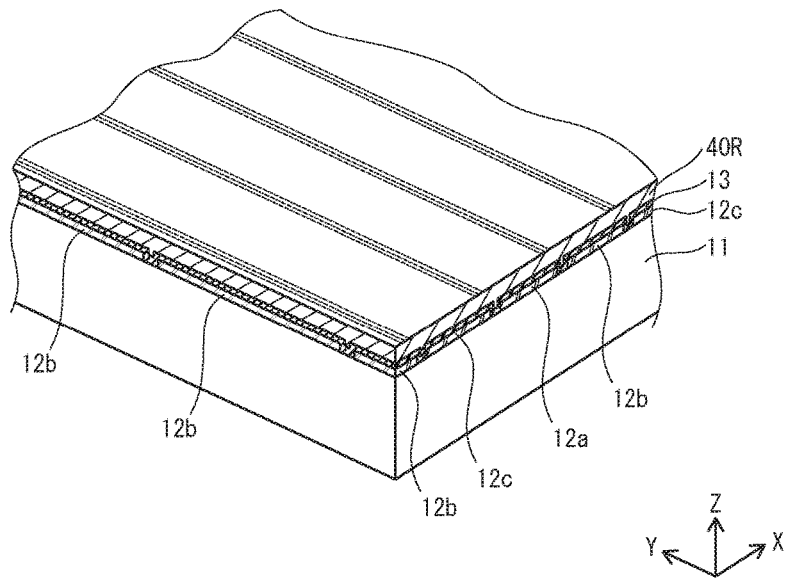
FIG. 4A and FIG. 4B illustrate a method of manufacturing the display panel of FIG. 1.

As illustrated in FIG. 4A, the hole injection layer 13 is formed above the substrate 11 on which the lower electrodes 12 have been formed, and then a bank material film 40R is formed on the entire hole injection layer 13. The substrate 11 is formed through a known technology and includes a glass substrate, and a TFT layer and an interlayer electrically-insulating layer that are formed on the glass substrate. The lower electrodes 12 are obtained by forming a metal film on the substrate 11 through sputtering or vacuum vapor deposition and then patterning the metal film. The hole injection layer 13 is obtained by forming a metal oxide film through sputtering or vacuum vapor deposition above the substrate 11 on which the lower electrodes 12 have been formed. The bank material film 40R is obtained by applying hydrophilic photoresist in a liquid state through an application process such as spin coating.

Figure 4B:
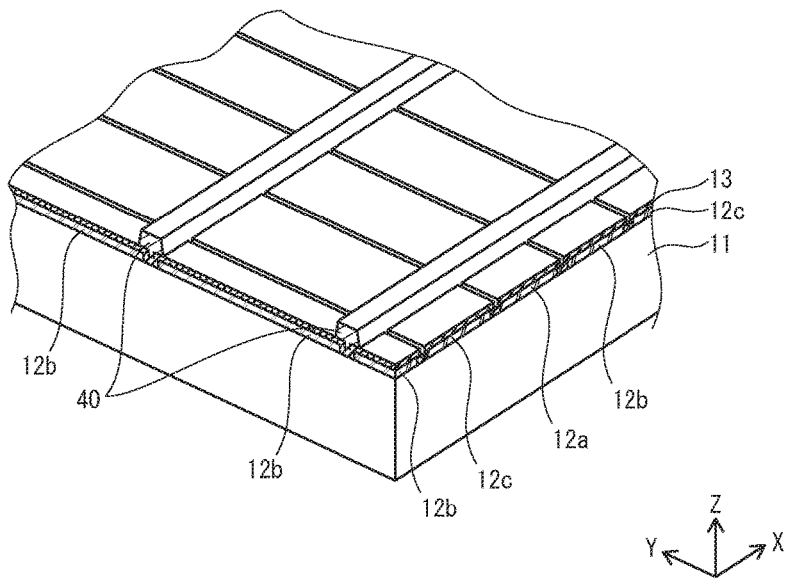

Next, the row banks 40 are formed as illustrated in FIG. 4B. The row banks 40 are obtained by patterning the bank material film 40R through exposure and development and then performing baking. Specifically, in the exposure process, the bank material film 40R is exposed to ultraviolet light through a mask and portions of the bank material film 40R are cured. In the development process, portions of the bank material film 40R which have not been cured are removed by using a developer.

Figure 5A:
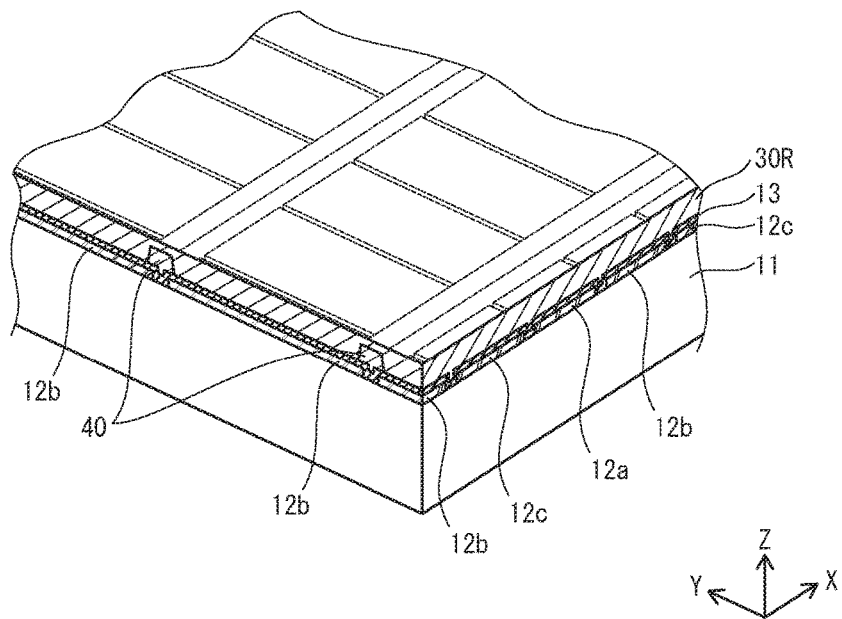
FIG. 5A and FIG. 5B illustrate the method of manufacturing the display panel of FIG. 1.

As illustrated in FIG. 5A, a bank material film 30R is formed above the entire hole injection layer 13, on which the row banks 40 have been formed. Similarly to the forming of the bank material layer 40R, the bank material film 30R is obtained by applying photoresist containing fluorine in a liquid state through an application process such as spin coating.

Figure 5B:
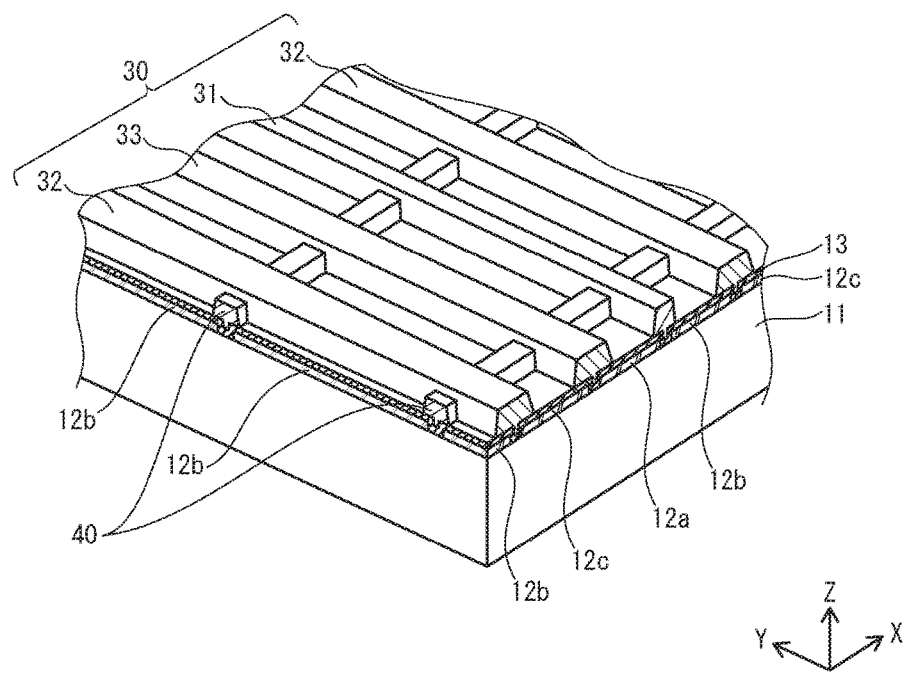

Further, the column banks 30 are formed as illustrated in FIG. 5B. The column banks 30 are obtained by patterning the bank material film 30R through exposure and development and then performing baking. Specifically, in the exposure process, the bank material film 30R is exposed to ultraviolet light through a mask and portions of the bank material film 30R are cured. In the development process, portions of the bank material film 30R which have not been cured are removed by using a developer.

As described above, when forming the column banks 30, the first column banks 31, the second column banks 32, and the third column banks 33 are formed simultaneously in a single manufacturing process.

4. Effects

Figure 6A:
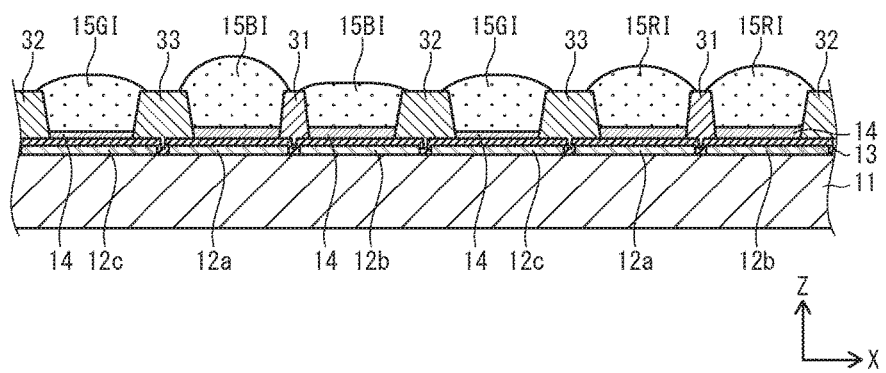
FIG. 6A through FIG. 6C illustrate the method of manufacturing the display panel of FIG. 1.
Figure 6B:
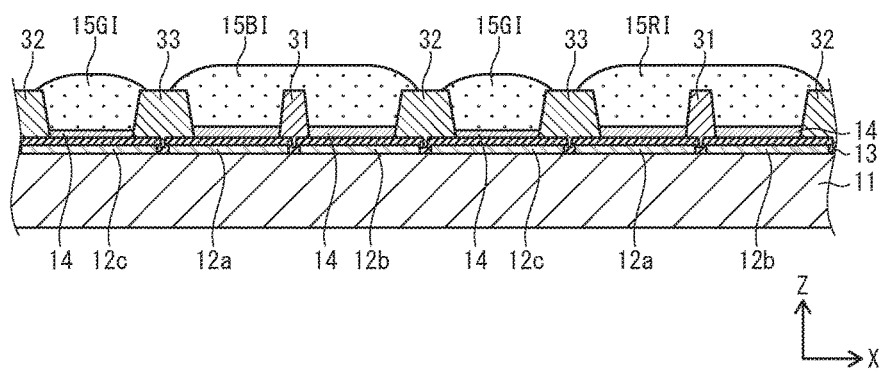
Figure 6C:
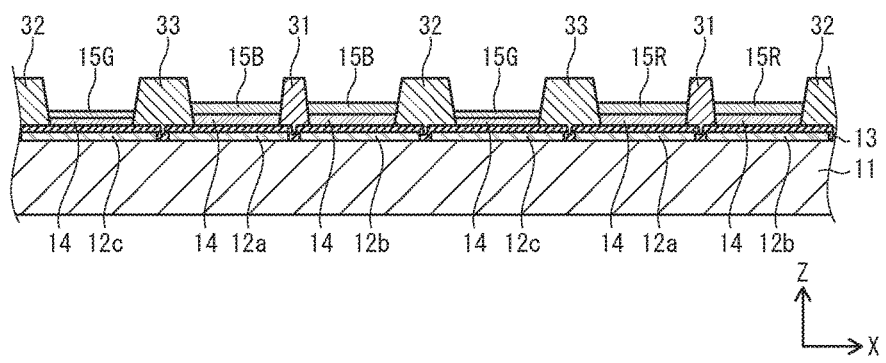
Figure 7A:
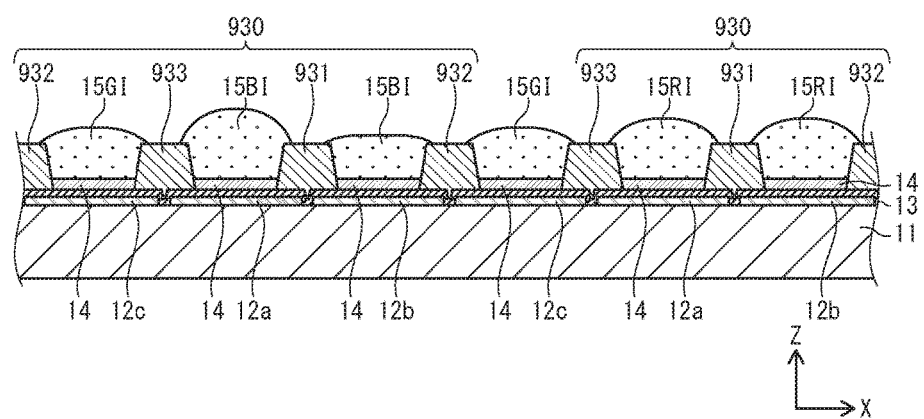
FIG. 7A and FIG. 7B illustrate a method of manufacturing a display panel pertaining to a comparative example.
Figure 7B:
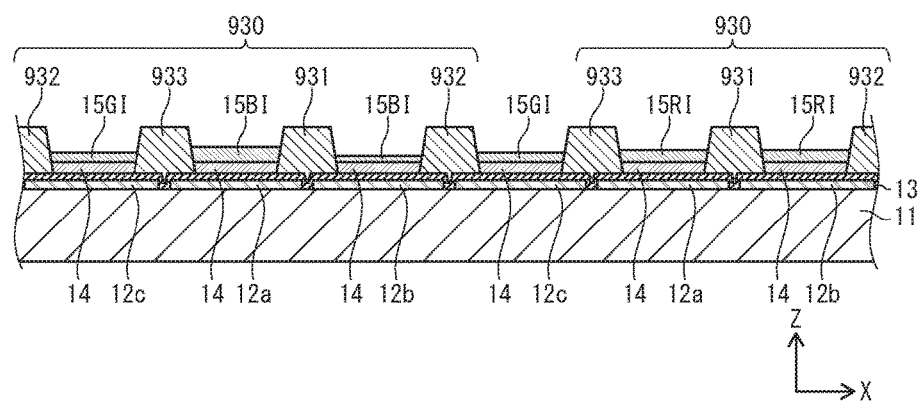
Figure 8A:
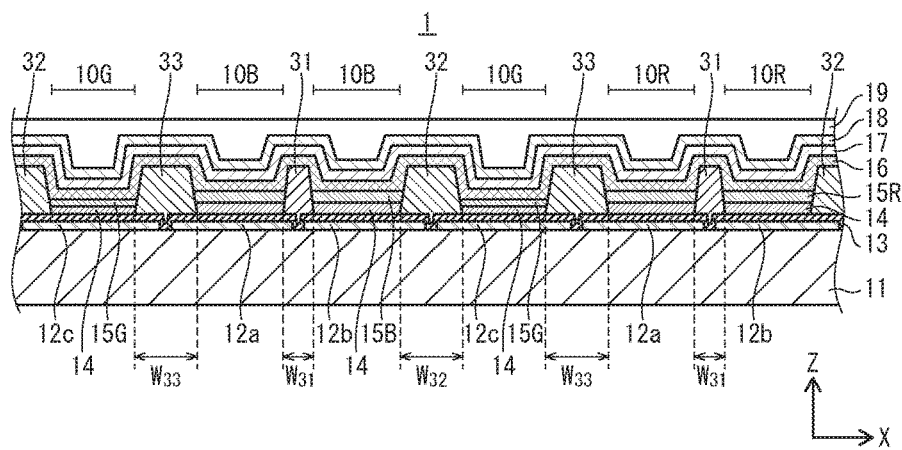
FIG. 8A and FIG. 8B illustrate what an opening ratio of a display panel is.
Figure 8B:
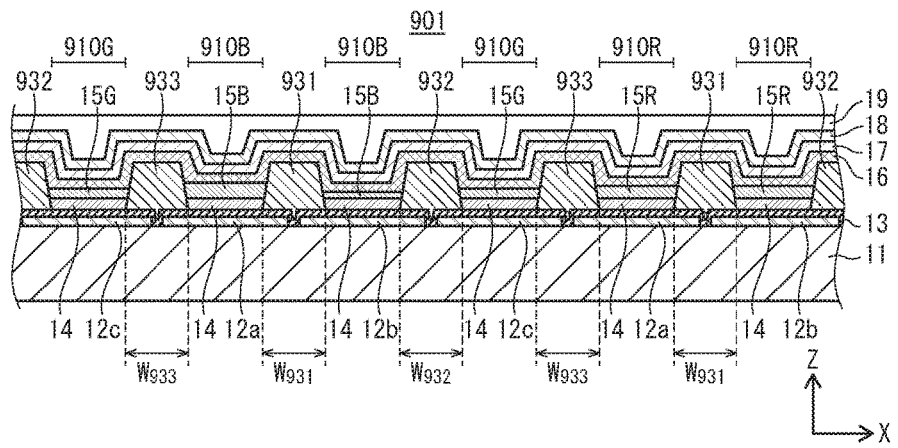

Next, effects of the column banks 30 are described with reference to FIG. 6A, FIG. 6B, FIG. 6C, FIG. 7A, FIG. 7B, FIG. 8A, and FIG. 8B. FIG. 6A through FIG. 6C are cross-sectional views illustrating how the organic light-emitting layers 15 of the display panel 1 pertaining to the present embodiment are formed. FIG. 7A and FIG. 7B are cross-sectional views illustrating how organic light-emitting layers 15 of a display panel 901 are formed. The display panel 901 is a display panel pertaining to a comparative example. The display panel 901 differs from the display panel 1 in that the first column banks have the same width as the second column banks and the third column banks, while in the display panel 1, the first column banks 31 have a smaller width than the second column banks 32 and the third column banks 33. FIG. 8A is a cross-sectional view of the display panel 1 pertaining to the present embodiment, and FIG. 8B is a cross-sectional view of the display panel 901 pertaining to the comparative example.

(First Effect of Column Banks 30)

Both the display panel 1 and the display panel 901 are designed so that the red organic light-emitting layers and the blue organic light-emitting layers have a greater thickness than the green organic light-emitting layers. Accordingly, in both the display panel 1 and the display panel 901, an amount of a red organic light-emitting material ink applied per unit area and an amount of a blue organic light-emitting material ink applied per unit area are greater than an amount of a green organic light-emitting material ink applied per unit area. Further, although application amounts of the blue organic light-emitting material inks are supposed to be the same as one another, they accidentally vary in both the display panel 1 and the display panel 901. Meanwhile, in the display panel 1, the first column banks have a smaller width than the second column banks and the third column banks. However, the display panel 901 differs from the display panel 1 in that the first column banks have the same width as the second column banks and the third column banks.

The following describes how the organic light-emitting layers 15 of the display panel 901 pertaining to the comparative example are formed, with reference to FIG. 7A and FIG. 7B. In the following, whenever it is unnecessary to distinguish a first column bank 931, a second column bank 932, and a third column bank 933 from one another, the term "column bank 930" is used. As illustrated in FIG. 7A, inks including organic light-emitting materials are applied to regions between column banks 930 that are adjacent in the X-axis direction above the substrate 11, on which the lower electrodes 12, the hole injection layer 13, and the hole transport layers 14 have been formed. Specifically, a blue organic light-emitting material ink 15BI or a red organic light-emitting material ink 15RI is ejected into each region between a first column bank 931 and a second column bank 932. A green organic light-emitting material ink 15GI is ejected into each region between a second column bank 932 and a third column bank 933. Further, a blue organic light-emitting material ink 15BI or a red organic light-emitting material ink 15RI is ejected into each region between a third column bank 933 and a first column bank 931. Whenever it is unnecessary to distinguish the red organic light-emitting material inks 15RI, the green organic light-emitting material inks 15GI, and the blue organic light-emitting material inks 15BI from one another, the term "organic light-emitting material inks 15I" is used. The organic light-emitting material inks 15I that have been ejected are held in the regions between the column banks 930 with the upper surfaces of the organic light-emitting material inks 15I bulging upwards out from the regions between the column banks 930 and ends in the X-axis direction of the organic light-emitting material inks 15I extending onto the column banks 930. The greater the application amounts of the organic light-emitting material inks 15I, the greater the widths of the ends of the organic light-emitting material inks 15I extending onto the column banks 930. Because all of the column banks 930 are relatively wide in the display panel 901, adjacent organic light-emitting material inks 15I do not contact each other on the column banks 930. Further, although application amounts of the blue organic light-emitting material inks 15BI are supposed to be the same as each other, they accidentally vary. Accordingly, the blue organic light-emitting layers 15B, which are formed through drying the organic light-emitting material inks 15I, have thicknesses differing from each other as illustrated in FIG. 7B.

The following describes how the organic light-emitting layers 15 pertaining to the display panel 1 are formed, with reference to FIG. 6A through FIG. 6C. As illustrated in FIG. 6A, a blue organic light-emitting material ink 15BI or a red organic light-emitting material ink 15RI is ejected into each region between a first column bank 31 and a second column bank 32. A green organic light-emitting material ink 15GI is ejected into each region between a second column bank 32 and a third column bank 33. Further, a blue organic light-emitting material ink 15BI or a red organic light-emitting material ink 15RI is ejected into each region between a third column bank 33 and a first column bank 31. Although application amounts of the blue organic light-emitting material inks 15BI are supposed to be the same as each other, they accidentally vary. Meanwhile, the width $W_{31}$ of the first column banks 31 is smaller than the width $W_{32}$ of the second column banks 32 and the width $W_{33}$ of the third column banks 33. Further, blue organic light-emitting material inks 15BI, which have the same light-emission color as each other, are adjacent to each other and are separated by a first column bank 31. Accordingly, the adjacent blue organic light-emitting material inks 15BI spread onto the first column bank 31 and contact each other. Likewise, the adjacent red organic light-emitting material inks 15RI spread onto the first column bank 31 and contact each other.

The blue organic light-emitting material inks 15BI that have come in contact with each other form a single ink puddle, as illustrated in FIG. 6B. Likewise, the red organic light-emitting material inks 15RI that have come in contact with each other form a single ink puddle, as illustrated in FIG. 6B. Accordingly, even when application amounts of the blue organic light-emitting material inks 15BI differ from one another, the volume of the blue organic light-emitting material residing in regions between the column banks 30 is equalized. As a result, as illustrated in FIG. 6C, thicknesses of the consequently-formed blue organic light-emitting layers 15B is prevented from differing from one another.

(Second Effect of Column Banks 30)

As illustrated in FIG. 6B, in the display panel 1, an ink puddle formed by blue organic light-emitting material inks 15BI that have come in contact with each other has a greater height than when supposing that organic light-emitting material inks are separated by the first column banks 31. The same applies to the red organic light-emitting material ink 15RI. That is, the volume of the blue organic light-emitting material ink 15BI per unit area and the volume of the red organic light-emitting material ink 15RI per unit area are great in the display panel 1. Accordingly, the organic light-emitting layers are provided with a sufficient thickness even though the subpixels have a small size, due to the great volume of organic light-emitting material ink per unit area.

(Third Effect of Column Banks 30)

As illustrated in FIG. 6A, the second column banks 32 and the third column banks 33 have a greater width than the first column banks 31. Accordingly, a red organic light-emitting material ink 15RI and a green organic light-emitting material ink 15GI that are adjacent to each other are prevented from contacting each other on a second column bank 32. Likewise, a blue organic light-emitting material ink 15BI and a green organic light-emitting material ink 15GI that are adjacent to each other are prevented from contacting each other on a third column bank 33. That is, color mixture of the organic light-emitting material inks 15I is prevented.

(Fourth Effect of Column Banks 30)

In the display panel 901, a width $W_{931}$ of the first column banks 931 is the same as a width $W_{932}$ of the second column banks 932 and a width $W_{933}$ of the third column banks 933, as illustrated in FIG. 8B. Meanwhile, in the display panel 1, the width $W_{31}$ of the first column banks 31 is smaller than the width $W_{32}$ of the second column banks 32 and the width $W_{33}$ of the third column banks 33, as illustrated in FIG. 8A. Accordingly, the surface area of the display panel 1 occupied by the column banks 30 is smaller than the surface area of the display panel 901 occupied by the column banks 930.

As described above, the organic light-emitting elements 10 have widths corresponding to the widths of portions of the lower electrodes 12 that are not covered by the column banks 30. Organic light-emitting element width is thus dependent upon column bank width and pixel width. Accordingly, the widths of the organic light-emitting elements 10R, 10G, and 10B in the display panel 1 are greater than the widths of the organic light-emitting elements 910R, 910E and 910B in the display panel 901, respectively. That is, the display panel 1 has a greater opening ratio than the display panel 901.

Embodiment 2

Figure 9:
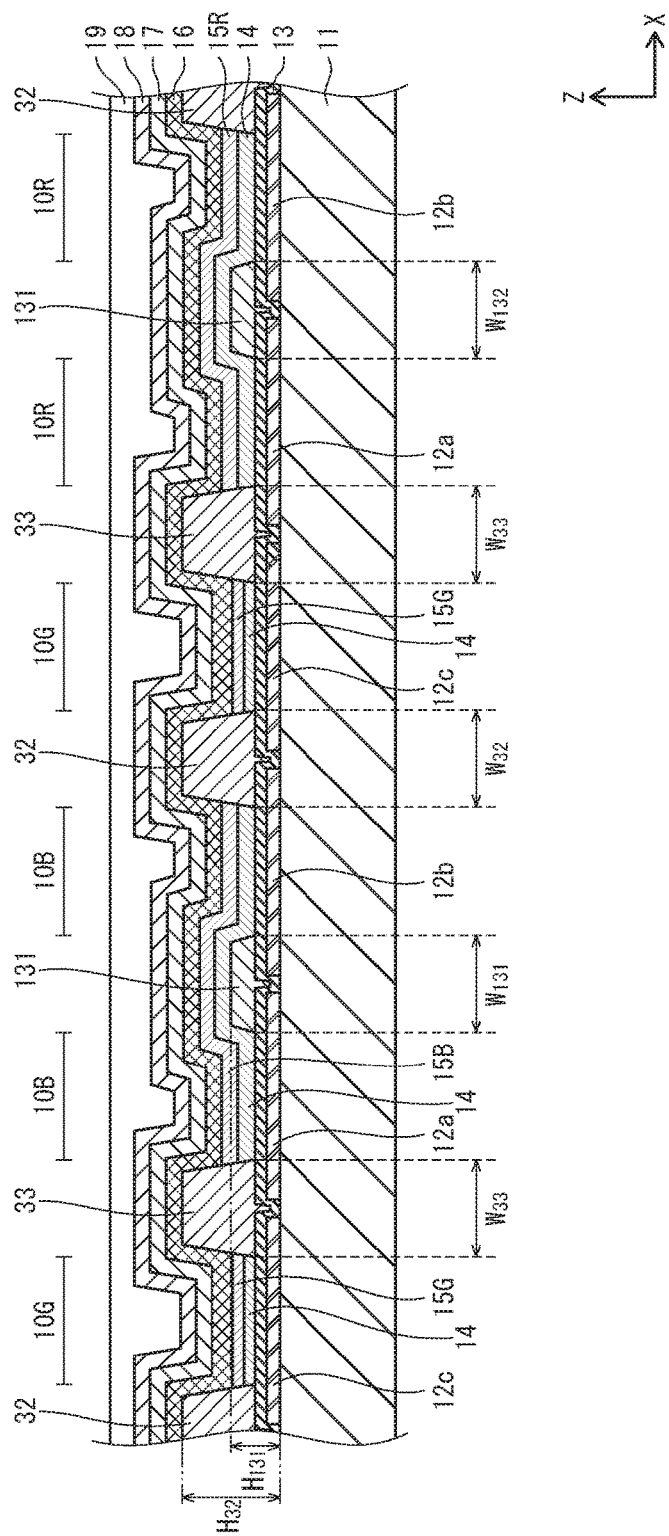
FIG. 9 is a schematic cross-sectional view of a display panel pertaining to Embodiment 2 of the present disclosure, taken in the X-axis direction.

The following describes Embodiment 2, with reference to FIG. 9, FIG. 10, FIG. 11A, and FIG. 11B. A basic structure of a display panel 101 of Embodiment 2 illustrated in a cross-sectional view in FIG. 9 is substantially the same as Embodiment 1. Embodiment 2 differs from Embodiment 1 in that first column banks have a lower height than second column banks and third column banks, and that the first column banks, the second column banks, and the third column banks have the same width as one another. Note that components that appear in Embodiment 1 are indicated by using the same reference signs, and the explanation thereof is omitted as necessary.

1. Structure of Display Panel 101

Whenever it is unnecessary to distinguish first column banks 131, the second column banks 32, and the third column banks 33 in the display panel 101 from one another, the term "column banks 130" is hereinafter used. In the display panel 101, a width $W_{131}$ of the first column banks 131, a width $W_{32}$ of the second column banks 32, and a width $W_{33}$ of the third column banks 33 are the same as one another. Meanwhile, a height $H_{131}$ of the first column banks 131 is lower than a height $H_{32}$ of the second column banks 32 and the third column banks 33. Accordingly, in the display panel 101, hole transport layers 14 that are adjacent in the X-axis direction extend onto first column banks 131 and are in contact with each other. Further, blue organic light-emitting layers 15B that are adjacent in the X-axis direction extend onto first column banks 131 and are in contact with each other. Likewise, red organic light-emitting layers 15R that are adjacent in the X-axis direction extend onto first column banks 131 and are in contact with each other.

For example, the height $W_{131}$ of the first column banks 131 is 0.5 μm or more and 1 μm or less. For example, the height $W_{32}$ of the second column banks 32 and the third column banks 33 is 1 μm or more and 2 μm or less. The height $H_{131}$ of the first column banks 131 is, for example, 60% or less of the height $H_{32}$ of the second column banks 32 and the third column banks 33.

Figure 10:
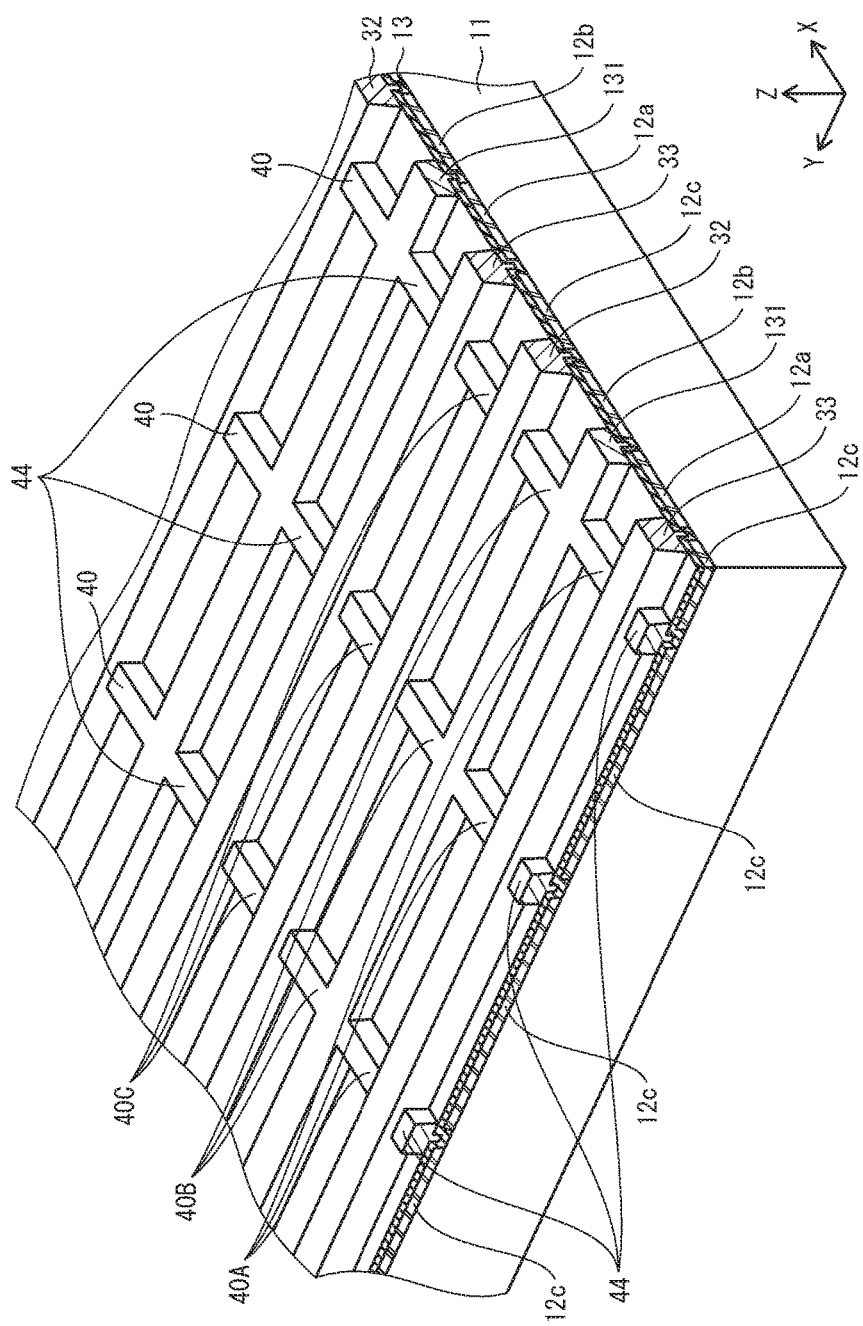
FIG. 10 is a partially-cutout perspective view illustrating shapes of column banks and row banks of the display panel of FIG. 9.

FIG. 10 is a partially-cutout perspective view illustrating the column banks 130 and the row banks 40. Layers above the column banks 130 and the row banks 40 are not illustrated for the sake of clarity. In the present embodiment, the first column banks 131 and the row banks 40 have the same height as each other.

2. Effects

Figure 11A:
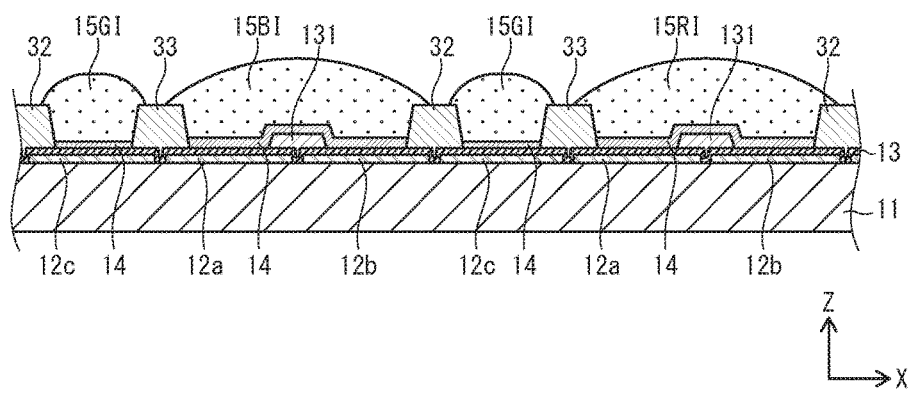
FIG. 11A and FIG. 11B illustrate a method of manufacturing the display panel of FIG. 9.
Figure 11B:
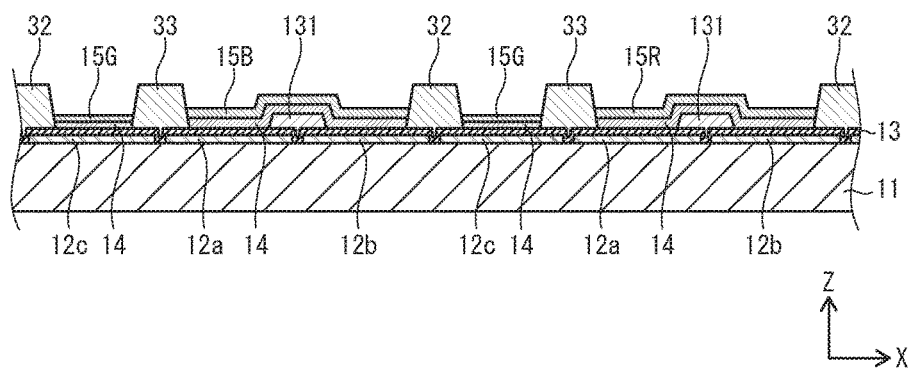

FIGS. 11A and 11B are cross-sectional views illustrating how the organic light-emitting layers 15 in the display panel 101 are formed. FIG. 11A is a cross-sectional view illustrating a state in which the organic light-emitting material inks 15I have been applied to regions between adjacent column banks 130. Because the first column banks 131 have a lower height than the second column banks 32 and the third column banks 33, blue organic light-emitting material inks 15BI contact each other above a first column bank 131 and form a single ink puddle. Likewise, red organic light-emitting material inks 15RI contact each other above a first column bank 131 and form a single ink puddle. Then, the organic light-emitting layers 15 are formed through drying the organic light-emitting material inks, as illustrated in FIG.

11B. In the display panel 101, the thicknesses of the blue organic light-emitting layers 15B are prevented from differing from one another because blue organic light-emitting material inks 15BI contact each other above a first column bank 131 and form a single ink puddle. Likewise, in the display panel 101, the thicknesses of the red organic light-emitting layers 15R are prevented from differing from one another because red organic light-emitting material inks 15RI contact each other above a first column bank 131 and form a single ink puddle.

The second column banks 32 and the third column banks 33 have a greater height than the first column banks 131. Accordingly, a red organic light-emitting material ink 15RI and a green organic light-emitting material ink 15GI that are adjacent to each other are prevented from contacting on a second column bank 32. Likewise, a blue organic light-emitting material ink 15BI and a green organic light-emitting material ink 15GI that are adjacent to each other are prevented from contacting on a third column bank 33. That is, color mixture of the organic light-emitting material inks 15I is prevented.

Embodiment 3

Figure 12:
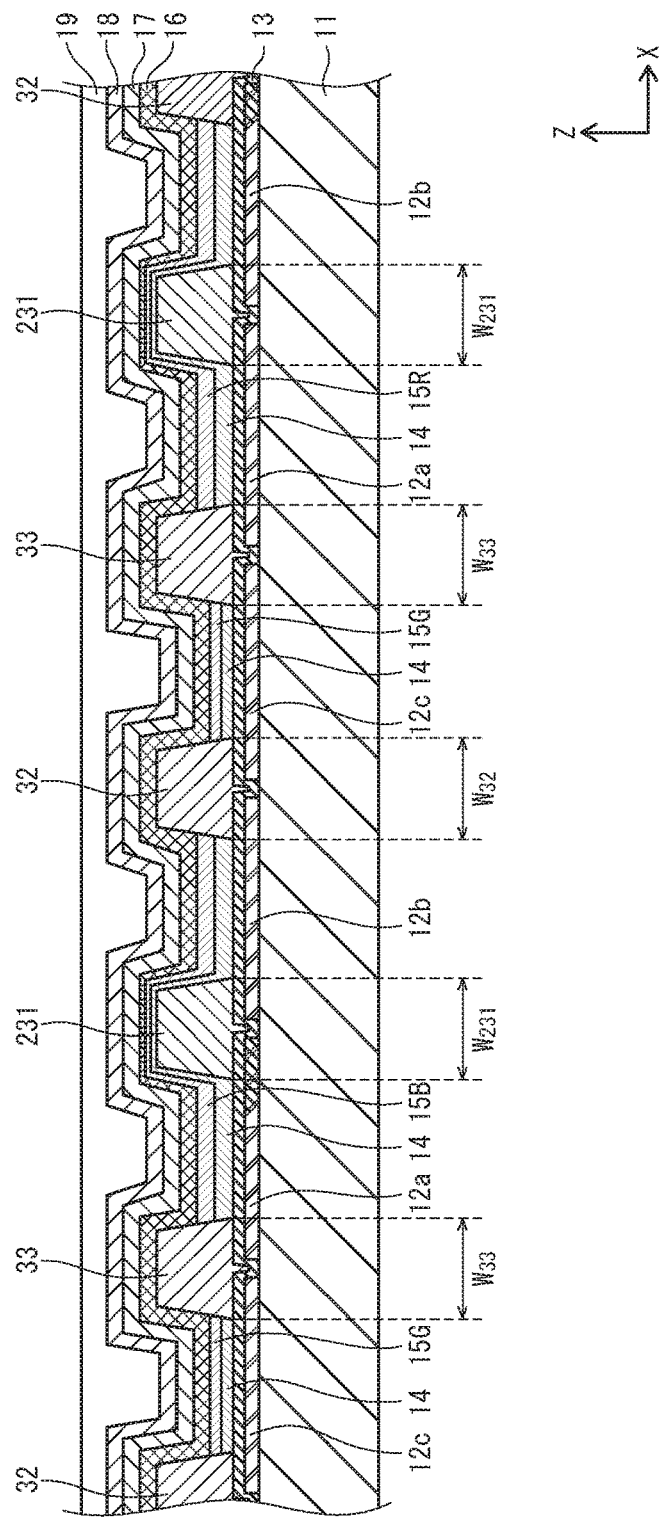
FIG. 12 is a schematic cross-sectional view of a display panel pertaining to Embodiment 3 of the present disclosure, taken in the X-axis direction.

The following describes Embodiment 3, with reference to FIG. 12. A basic structure of a display panel 201 of Embodiment 3 illustrated in a cross-sectional view in FIG. 12 is substantially the same as Embodiment 1. Embodiment 3 differs from embodiment 1 in that first column banks, second column banks, and third column banks have the same height as one another, that the first column banks, the second column banks, and the third column banks have the same width as one another, and that the first column banks have lower liquid repellency than the second column banks and the third column banks. Note that components that appear in Embodiment 1 are indicated by using the same reference signs, and the explanation thereof is omitted as necessary.

1. Structure of Display Panel 201

Whenever it is unnecessary to distinguish first column banks 231, the second column banks 32, and the third column banks 33 in the display panel 201 from one another, the term "column banks 230" is hereinafter used. In the display panel 201, a width $W_{231}$ of the first column banks 231, a width $W_{32}$ of the second column banks 32, and a width $W_{33}$ of the third column banks 33 are the same as one another. The first column banks 231, the second column banks 32, and the third column banks 33 have the same height as one another. The first column banks 231 have lower liquid repellency than the second column banks 32 and the third column banks 33. Accordingly, in the display panel 201, hole transport layers 14 are in contact with each other on a first column bank 231 and blue organic light-emitting layers 15B are in contact with each other above a first column bank 231. Likewise, hole transport layers 14 are in contact with each other on a first column bank 231 and red organic light-emitting layers 15R are in contact with each other above a first column bank 231.

The column banks 230 and the row banks 40 can be formed through following processes: first, the row banks 40 are formed; then, the first column banks 231 are formed; and finally, the second column banks 32 and the third column banks 33 are formed in a single manufacturing process.

Meanwhile, the column banks 230 and the row banks 40 may be formed through other manufacturing processes. How the column banks 230 and the row banks 40 are formed is selected in accordance with the material, liquid repellency, and height of the column banks 230 and the row banks 40.

In order to impart liquid repellency to the column banks 230, the column banks 230 may be made of photoresist containing fluorine. Alternatively, liquid repellency may be imparted to the column banks 230 by forming column banks by using an organic material that does not contain fluorine and applying a surface treatment to the column banks. The surface treatment for imparting liquid repellency includes: applying exposure and development to the organic material; then performing a plasma treatment using a fluorine gas through a mask having openings corresponding to regions which are to have liquid repellency; and finally removing the mask.

When the column banks 230 and row banks 40 include banks whose height differ from the height of other banks, the banks with the different height may not necessarily be formed through processes differing from processes for forming the other banks. The banks having different heights may be formed, during patterning after application of an organic material, by using a halftone mask having portions with different light transmittance ratios in different portions. Using such a halftone mask enables forming of banks simultaneously in a single manufacturing process, irrespective of differences in heights among banks.

The following describes modifications of the method of manufacturing the column banks 230 and the row banks 40 in detail. When the column banks 230 and the row banks 40 are made of an organic material, the column banks 230 and the row banks 40 can be formed through the following processes: first, the row banks 40 are formed; then, the first column banks 231, a second column bank material layer, and a third column bank material layer that are made of an organic material containing no fluorine are formed simultaneously in a single manufacturing process; and finally, the second column banks 32 and the third column banks 33 are formed while imparting liquid repellency to the second column bank material layer and the third column bank material layer through a surface treatment. Alternatively, row banks and a column bank material layer made of an organic material containing no fluorine may be formed simultaneously in a single manufacturing process by using a halftone mask, and then the second column banks and the third column banks may be formed while imparting liquid repellency to the second column bank material layer and the third column bank material layer through a surface treatment.

When the first column banks 231 and the row banks 40 are made of an inorganic material and the liquid-repellent second column banks and third column banks are made of an organic material, the first column banks 231 and the row banks 40 may be formed simultaneously in a single manufacturing process and then the second column banks and the third column banks may be formed from photoresist containing fluorine. Alternatively, the column banks and the row banks may be formed through the following processes: first, the first column banks 231 and the row banks 40 are formed simultaneously in a single manufacturing process; then, a second and third column bank material layer made of an organic material containing no fluorine are formed; and finally, the second column banks and the third column banks are formed while imparting liquid repellency to the second column bank material layer and the third column bank material layer through a surface treatment.

Note that column banks and row banks of structures other than Embodiment 3, in a manner similar to the column banks and the row banks of Embodiment 3, may be formed through various manufacturing processes.

2. Effects

The first column banks 231 have lower liquid repellency than the second column banks 32 and the third column banks 33. Accordingly, blue organic light-emitting material inks 15BI form ink puddles on the first column banks 231 during forming of the organic light-emitting layers 15. Likewise, red organic light-emitting material inks 15RI form ink puddles on the first column banks 231 during forming of the organic light-emitting layers 15. This prevents thicknesses of the blue organic light-emitting layers 15B from differing from one another, and thicknesses of the red organic light-emitting layers 15R from differing from one another.

Further, the second column banks 32 and the third column banks 33 have liquid repellency. Accordingly, a red organic light-emitting material ink 15RI and a green organic light-emitting material ink 15GI that are adjacent to each other are prevented from contacting on a second column bank 32. Likewise, a blue organic light-emitting material ink 15BI and a green organic light-emitting material ink 15GI that are adjacent to each other are prevented from contacting on a third column bank 33. That is, color mixture of the organic light-emitting material inks 15I is prevented.

Embodiment 4

Figure 13:
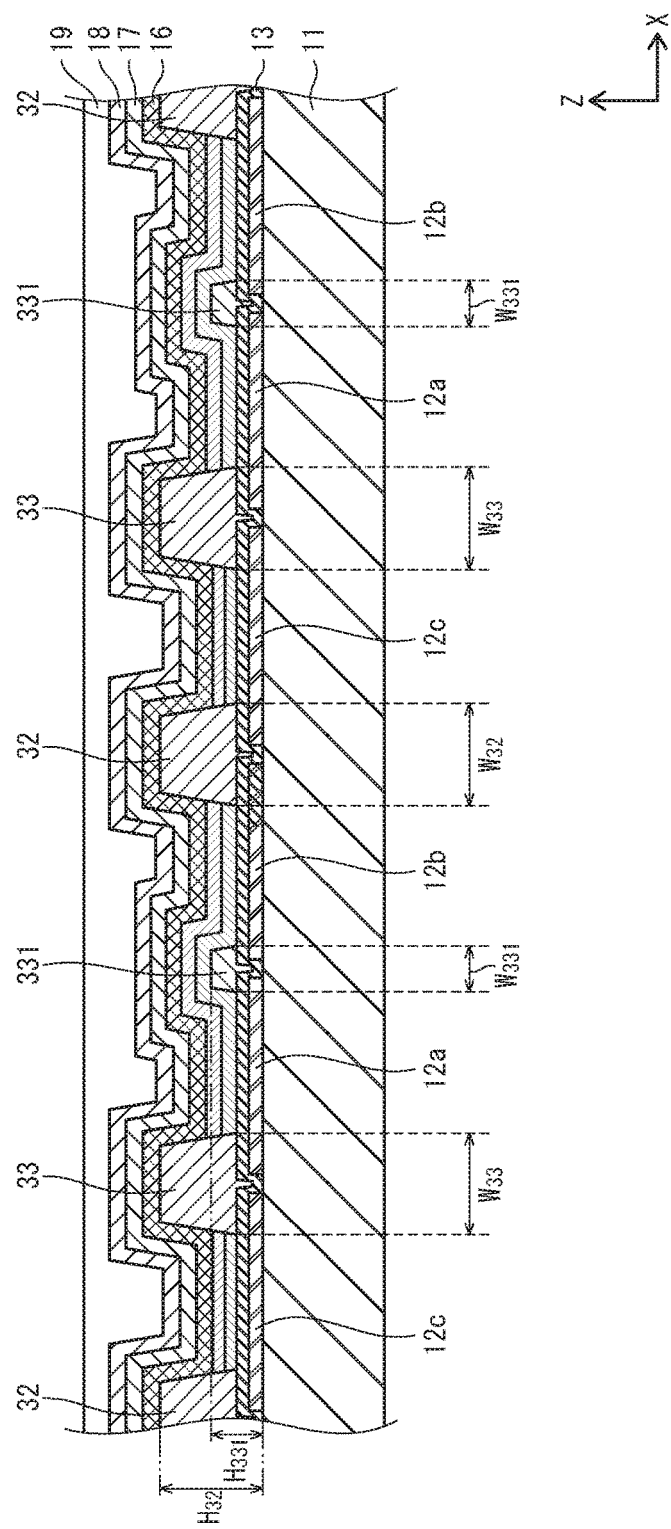
FIG. 13 is a schematic cross-sectional view of a display panel pertaining to Embodiment 4 of the present disclosure, taken in the X-axis direction.

The following describes Embodiment 4, with reference to FIG. 13. A basic structure of a display panel 301 of Embodiment 4 illustrated in a cross-sectional view in FIG. 13 is substantially the same as Embodiment 1. Embodiment 4 differs from Embodiment 1 in that the first column banks have a lower height than the second column banks and the third column banks, that the first column banks have a smaller width than the second column banks and the third column banks, and that the first column banks have lower liquid repellency than the second column banks and the third column banks. That is, the first column banks of Embodiment 4 possess all the characterizing features of the first column banks of Embodiment 1, the first column banks of Embodiment 2, and the first column banks of Embodiment 3. Note that components that appear in Embodiments 1, 2, and 3 are indicated by using the same reference signs, and the explanation thereof is omitted as necessary.

1. Structure of Display Panel 301

In the display panel 301, a height $H_{331}$ of first column banks 331 is lower than a height $H_{33}$ of the second column banks 32 and the third column banks 33. Further, a width $W_{331}$ of the first column banks 331 is smaller than a width $W_{32}$ of the second column banks 32 and a width $W_{33}$ of the third column banks 33. Additionally, the first column banks 331 have lower liquid repellency than the second column banks 32 and the third column banks 33.

The column banks 330 and the row banks 40 can be formed through the following processes: first, the row banks 40 are formed; then, the first column banks 331 are formed; and finally, the second column banks 32 and the third column banks 33 are formed.

2. Effects

In this structure, similarly to the other structures described above, the blue organic light-emitting material inks 15BI form ink puddles on the first column banks 331 during forming of the organic light-emitting layers 15. Likewise, the red organic light-emitting material inks 15RI form ink puddles on the first column banks 331 during forming of the organic light-emitting layers 15. Further, the first column banks 331 in the present embodiment are more likely to allow organic light-emitting material inks to spread onto themselves compared to the first column banks in Embodiments 1, 2, and 3. Because of this structure, organic light-emitting material inks that have the same light-emission color are more likely to contact each other. As a result, thicknesses of the blue organic light-emitting layers 15B are prevented from differing from one another more efficiently than in Embodiments 1, 2, and 3. Likewise, thicknesses of the red organic light-emitting layers 15R are prevented from differing from one another more efficiently than in Embodiments 1, 2, and 3.

Further, a red organic light-emitting material ink 15RI and a green organic light-emitting material ink 15GI that are adjacent to each other are prevented from contacting on a second column bank 32. Likewise, a blue organic light-emitting material ink 15BI and a green organic light-emitting material ink 15GI that are adjacent to each other are prevented from contacting on a third column bank 33. That is, color mixture of the organic light-emitting material inks 15I is prevented.

[Modifications]

The following describes modifications.

1. Modification 1

Figure 14:
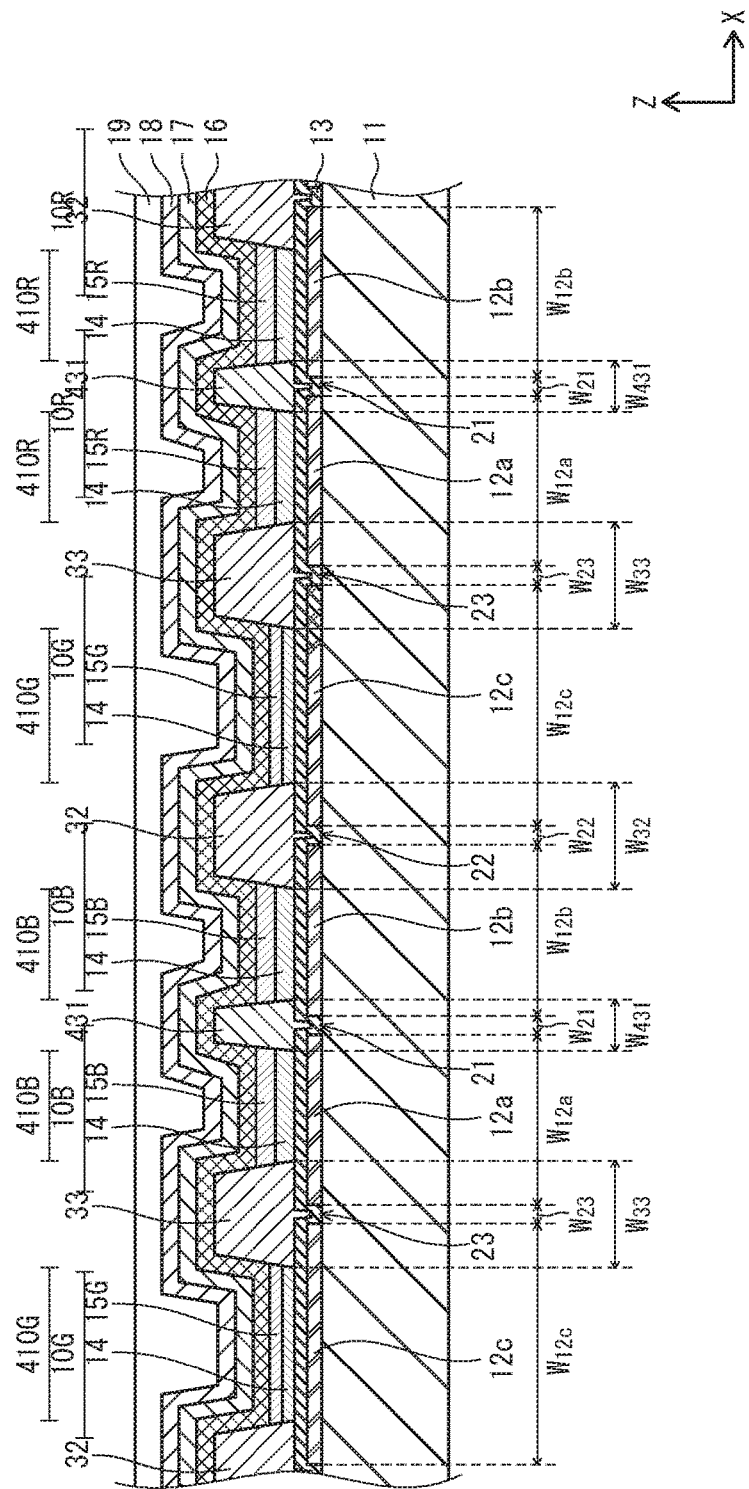
FIG. 14 is a schematic cross-sectional view of a display panel pertaining to Modification 1 of the present disclosure, taken in the X-axis direction.

The following describes Modification 1, with reference to FIG. 14. A basic structure of a display panel 401 of Modification 1 illustrated in a cross-sectional view in FIG. 14 is substantially the same as Embodiment 1. Modification 1 differs from Embodiment 1 in that widths of the lower electrodes differ from one another and that widths of portions of the lower electrodes that are not covered by the column banks differ from one another. Note that components that appear in Embodiment 1 are indicated by using the same reference signs, and the explanation thereof is omitted as necessary.

In the display panel 401, a width $W_{12a}$ of the first lower electrodes 12a and a width $W_{12b}$ of the second lower electrodes 12b are smaller than a width $W_{12c}$ of the third lower electrodes 12c. A width of portions of the first lower electrodes 12a that are not covered by the column banks 30 and a width of portions of the second lower electrodes 12b that are not covered by the column banks 30 are smaller than a width of portions of the third column banks 12c that are not covered by the column banks 30. The width of the portions of the first lower electrodes 12a that are not covered by the column banks 30 corresponds to a width $W_{410B}$ of blue organic light-emitting elements 410B, and the width of the portions of the second lower electrodes 12b that are not covered by the column banks 30 corresponds to a width $W_{410R}$ of red organic light-emitting elements 410R. The width of the portions of the third lower electrodes 12c that are not covered by the column banks 30 corresponds to a width $W_{410G}$ of green organic light-emitting elements 410G. That is, organic light-emitting layers 15 with different light-emission colors may be formed so as to have different widths of openings in the display panel 401. The luminance half-life of the display panel 401 as a whole is improved by increasing the width of openings of organic light-emitting layers 15 having a short luminance half-life and decreasing the widths of openings of organic light-emitting layers 15 having a long luminance half-life. Note that the term "luminance half-life" here refers to an amount of time required for luminance of an organic light-emitting layer 15 to decrease to half due to application of a predetermined driving current.

2. Modification 2

Figure 15:
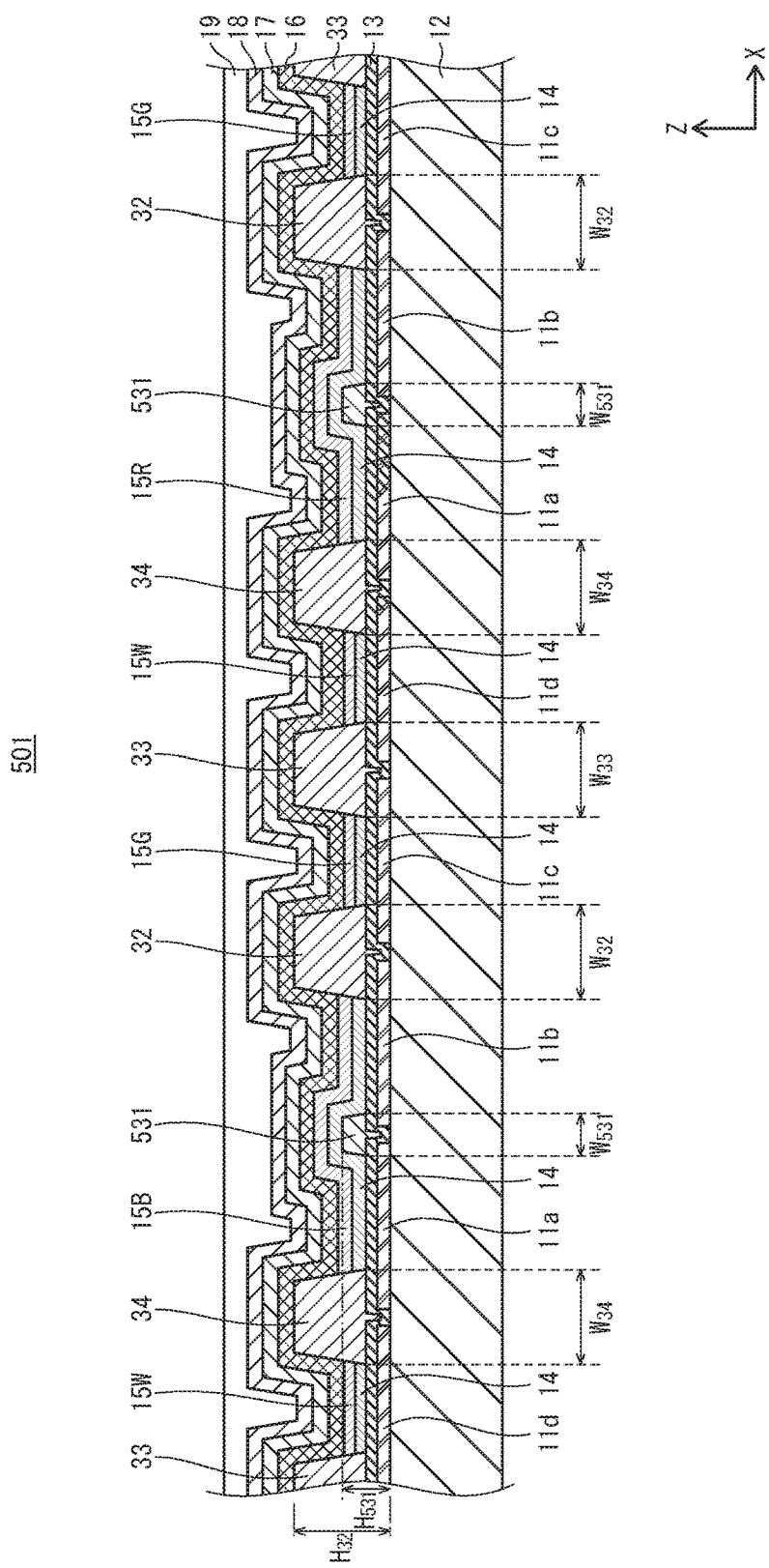
FIG. 15 is a schematic cross-sectional view of a display panel pertaining to Modification 2 of the present disclosure, taken in the X-axis direction.

The following describes Modification 2, with reference to FIG. 15. A basic structure of a display panel 501 of Modification 2 illustrated in a cross-sectional view in FIG. 15 is substantially the same as Embodiment 4. Modification 2 differs from Embodiment 4 in that the light-emission colors of the organic light-emitting layers are red, green, blue and white. Note that components that appear in Embodiment 4 are indicated by using the same reference signs, and the explanation thereof is omitted as necessary.

In display panel 501, a width $W_{531}$ of first column banks 531 is smaller than a width $W_{32}$ of the second column banks 32, a width $W_{33}$ of the third column banks 33, and a width $W_{34}$ of fourth column banks 34. A height $H_{531}$ of the first column banks 531 is lower than a height $H_{32}$ of the second column banks 32, the third column banks 33, and the fourth column banks 34. White organic light-emitting layers 15W are disposed in gaps each between a third column bank 33 and a fourth column bank 34 that are adjacent to each other. As described above, organic light-emitting elements in the display panel 501 are formed so as to have four light-emission colors. This enables the display panel 501 to emit light of higher luminance compared to display panels in which the light-emitting elements have three light-emission colors, without changing driving voltage.

3. Modification 3

In the above embodiments etc., the height of the row banks are such that organic light-emitting material inks applied to regions that are adjacent in the Y-direction and are sandwiched by row banks contact each other during forming of the organic light-emitting layers, the consequently-formed organic light-emitting layers extend onto the row banks and contact each other. However, the present disclosure should not be construed as being limited to this. The height of the row banks may be such that while the organic light-emitting material inks applied to regions that are adjacent in the Y-direction and are sandwiched by row banks contact each other during forming of the organic light-emitting layers, the consequently-formed organic light-emitting layers are separated from one another by the row banks. Further, the row banks may include high row banks and low row banks. The following describes such a modification with reference to FIG. 16 through FIG. 19.

Figure 16:
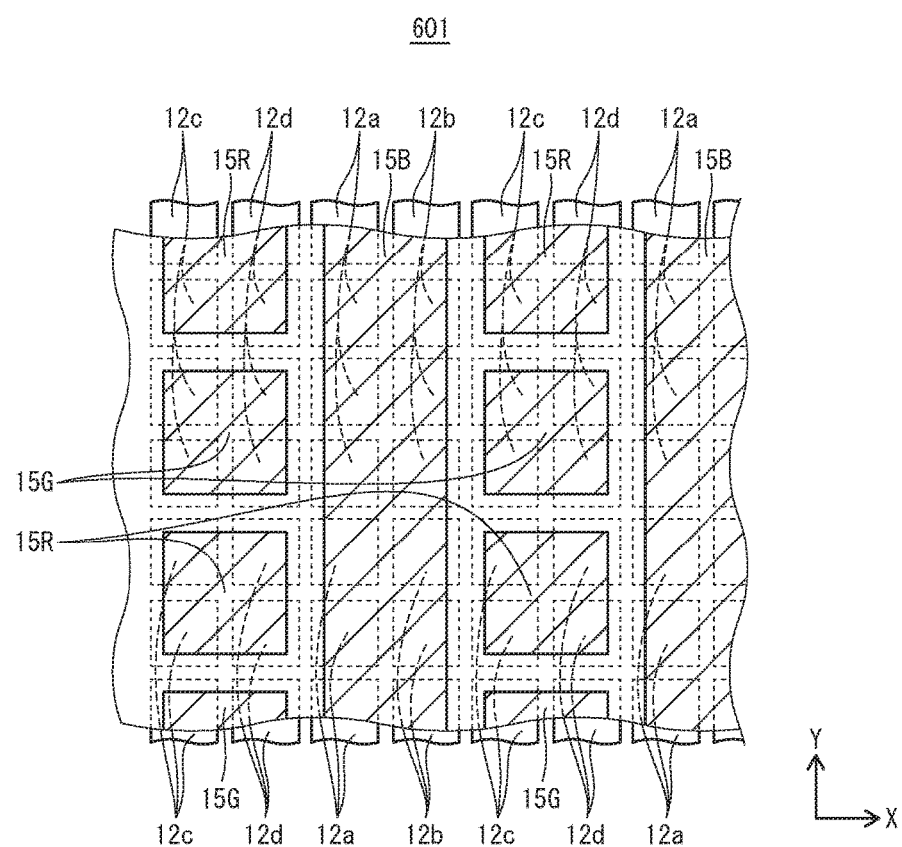
FIG. 16 illustrates an arrangement of lower electrodes and organic light-emitting layers in a display panel pertaining to Modification 3 of the present disclosure.

A display panel 601, whose layout is illustrated in FIG. 16, differs from Embodiment 1 in that an organic light-emitting layer is formed above each set of four lower electrodes or above each two lines of lower electrodes. Note that components that appear in Embodiment 1 are indicated by using the same reference signs, and the explanation thereof is omitted as necessary.

FIG. 16 illustrates an arrangement of lower electrodes and organic light-emitting layers in the display panel 601. Each linear blue organic light-emitting layer 15B covers a line of first lower electrodes 12a extending in the Y-axis direction and a line of second lower electrodes 12b that is adjacent to the line of the first lower electrodes 12a in the X-axis direction and extends in the Y-axis direction. Each square red organic light-emitting layer 15R covers two third lower electrodes 12c that are adjacent to each other in the Y-axis direction and two fourth lower electrodes 12d that are adjacent to the third lower electrodes 12c in the X-axis direction. Likewise, each square green organic light-emitting layer 15G covers two third lower electrodes 12c that are adjacent to each other in the Y-axis direction and two fourth lower electrodes 12d that are adjacent to the third lower electrodes 12c in the X-axis direction.

Figure 17:
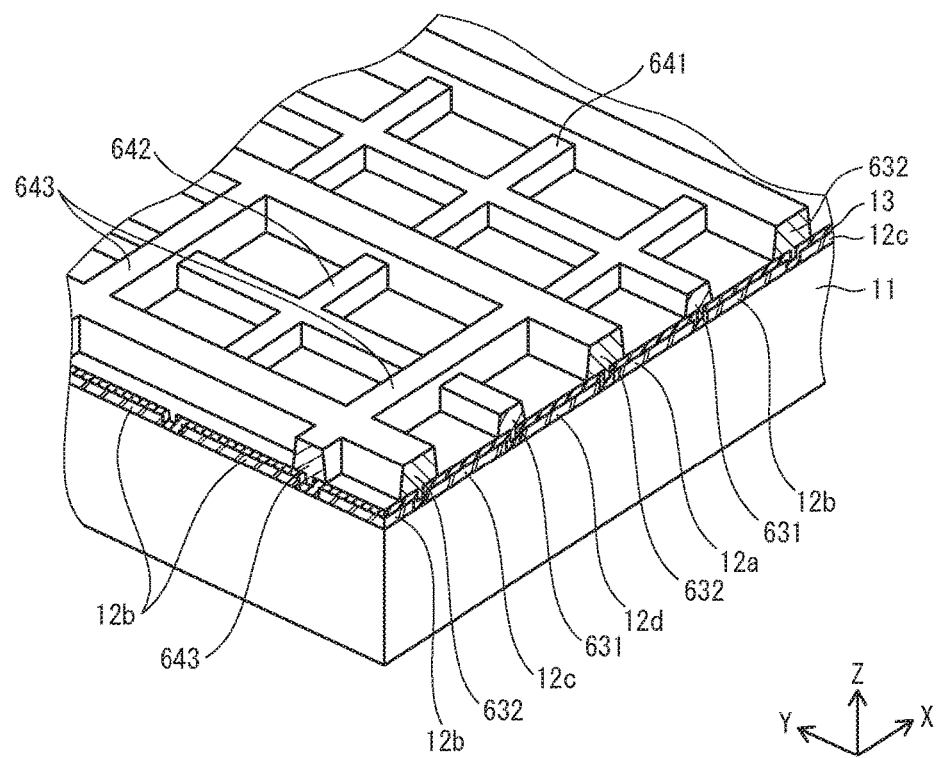
FIG. 17 is a partially-cutout perspective view illustrating shapes of column banks and row banks of the display panel of FIG. 16.

FIG. 17 is a partially-cutout perspective view illustrating the display panel 601. The display panel 601 includes first column banks 631 and second column banks 632 (whenever it is unnecessary to distinguish the first column banks 631 and the second column banks 632 from one another, the term "column banks 630" is hereinafter used), and first row banks 641, second row banks 642, and third row banks 643 (whenever it is unnecessary to distinguish the first row banks 641, the second row banks 642, and the third row banks 643 from one another, the term "row banks 640" is hereinafter used). Layers above the column banks 630 and the row banks 640 are not illustrated for the sake of clarity.

The first column banks 631 have a smaller width than the second column banks 632, have a lower height than the second column banks 632, and have lower liquid repellency than the second column banks 632. The first row banks 641 and the second row banks 642 have a lower height than the third row banks 643, and have the same height as the first column banks 631. The first row banks 641 and the second row banks 642 have lower liquid repellency than the third row banks 643. Accordingly, in the display panel 601, the column banks 630 and the row banks 640 can be formed through the following processes: first, the column banks 631, the first row banks 641, and the second row banks 642 are formed simultaneously in a single manufacturing process; and then, the second column banks 632 and the third row banks 643 are formed simultaneously in a single manufacturing process.

4. Modification 4

Figure 18:
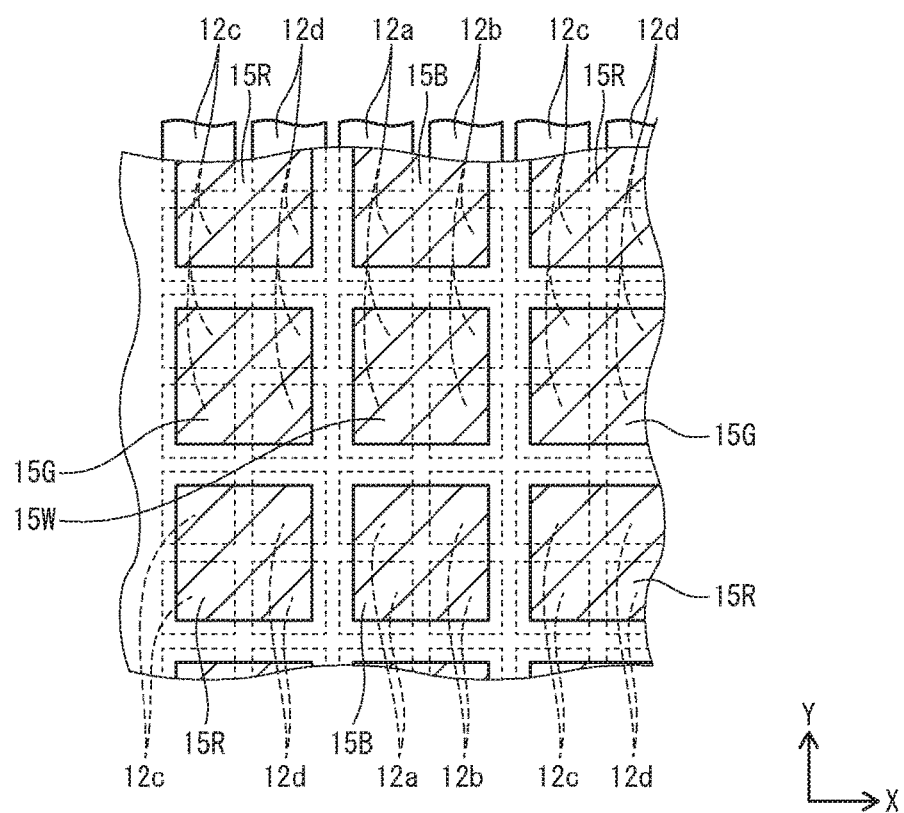
FIG. 18 illustrates an arrangement of lower electrodes and organic light-emitting layers in a display panel pertaining to Modification 4 of the present disclosure.

A display panel 701, whose layout is illustrated in FIG. 18, is a display panel pertaining to Modification 4. Modification 4 differs from Embodiment 1 in that each organic light-emitting layer covers four lower electrodes and that the light-emission colors of the organic light-emitting layers are red, green, blue, and white. Note that components that appear in Embodiment 1 are indicated by using the same reference signs, and the explanation thereof is omitted as necessary.

FIG. 18 illustrates an arrangement of lower electrodes and organic light-emitting layers in the display panel 701. Each square blue organic light-emitting layer 15B covers two first lower electrodes 12a that are adjacent to each other in the Y-axis direction and two second lower electrodes 12b that are adjacent to the first lower electrodes 12a in the X-axis direction. Likewise, Each square white organic light-emitting layer 15W covers two first lower electrodes 12a that are adjacent to each other in the Y-axis direction and two second lower electrodes 12b that are adjacent to the first lower electrodes 12a in the X-axis direction. Each square red organic light-emitting layer 15R covers two third lower electrodes 12c that are adjacent to each other in the Y-axis direction and two fourth lower electrodes 12d that are adjacent to the third lower electrodes 12c in the X-axis direction. Likewise, Each square green organic light-emitting layer 15G covers two third lower electrodes 12c that are adjacent to each other in the Y-axis direction and two fourth lower electrodes 12d that are adjacent to the third lower electrodes 12c in the X-axis direction.

Figure 19:
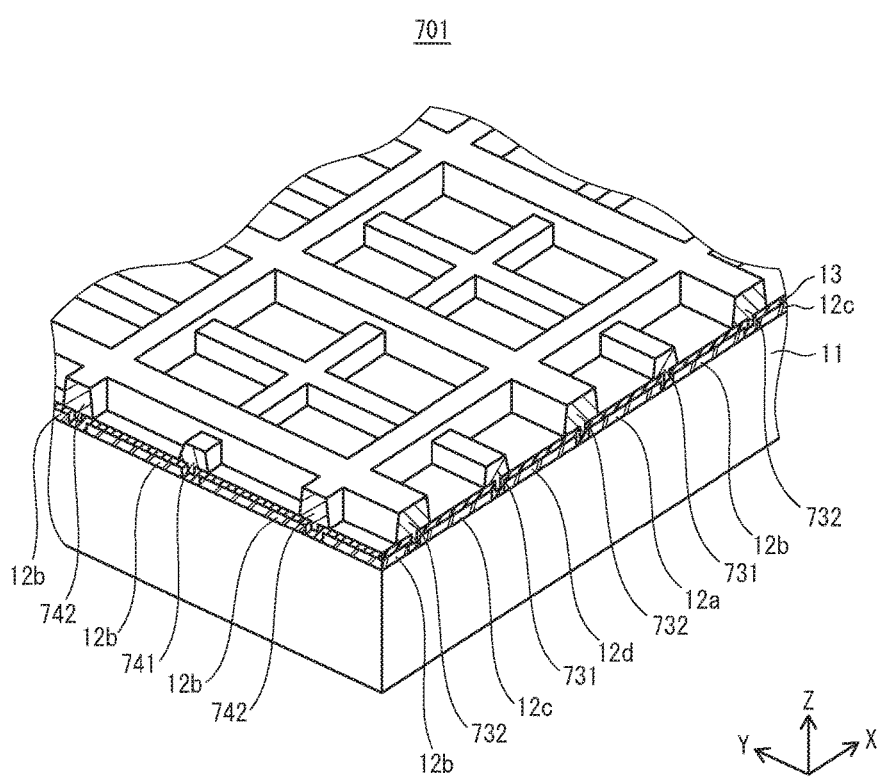
FIG. 19 is a partially-cutout perspective view illustrating shapes of column banks and row banks of the display panel of FIG. 18.

FIG. 19 is a partially-cutout perspective view illustrating the display panel 701. The display panel 701 includes first column banks 731 and second column banks 732 (whenever it is unnecessary to distinguish the first column banks 731 and the second column banks 732 from one another, the term "column banks 730" is hereinafter used) and first row banks 741, second row banks 742, and third row banks 743 (whenever it is unnecessary to distinguish the first row banks 741, the second row banks 742, and the third row banks 743 from one another, the term "row banks 740" is hereinafter used). Layers above the column banks 730 and row banks 740 are not illustrated for the sake of clarity.

The first column banks 731 have a smaller width than the second column banks 732, have a lower height than the second column banks 732, and have lower liquid repellency than the second column banks 732. The first row banks 741 have a lower height than the second row banks 742, have the same height as the first column banks 731, and have lower liquid repellency than the second row banks 742. Accordingly, in the display panel 701, the column banks 730 and the row banks 740 can be formed through the following processes: first, the column banks 731 and the first row banks 741 are formed simultaneously in a single manufacturing process; and then, the second column banks 632 and the second row banks 742 are formed simultaneously in a single manufacturing process.

As described above, a display panel can be designed freely because the display panel includes row banks having different heights.

5. Modification 5

As illustrated in FIG. 2, in Embodiment 1, the gaps between the lower electrodes 12 that are adjacent in the X-axis direction have the same width as one another, and the widths $W_{12a1}$ and $W_{12b1}$ of the portions of the lower electrodes 12 that are covered by the first column banks 31 are smaller than the widths $W_{12b2}$ and $W_{12c2}$ of the portions of the lower electrodes 12 that are covered by the second column banks 32 and the widths $W_{12c3}$ and $W_{12a1}$ of the portions of the lower electrodes 12 that are covered by the third column banks 33. However, the present disclosure should not be construed as being limited to this, and can be modified as in the following.

Figure 20:
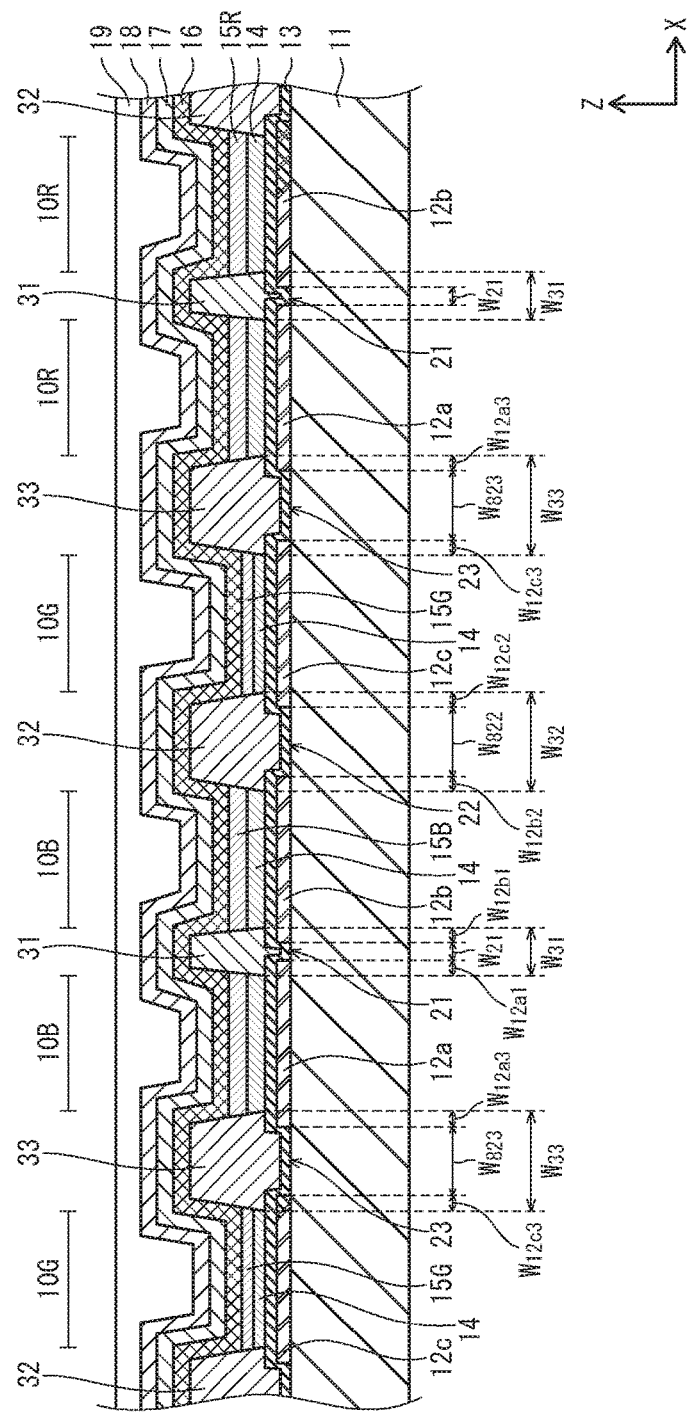
FIG. 20 is a schematic cross-sectional view of a display panel pertaining to Modification 5 of the present disclosure, taken in the X-axis direction.

FIG. 20 is a schematic cross-sectional view illustrating a display panel 801 pertaining to Modification 5. Note that components that appear in the display panel 1 pertaining to Embodiment 1 are indicated by using the same reference signs, and the explanation thereof is omitted as necessary.

A basic structure of the display panel 801 is substantially the same as the structure of the display panel 1. The display panel 801 differs from the display panel 1 pertaining to Embodiment 1 in that widths of portions of the lower electrodes covered by the first column banks, widths of portions of the lower electrodes covered by the second column banks, and widths of portions of the lower electrodes covered by the third column banks are the same as one another, and that a width $W_{21}$ of a gap 21 between a first lower electrode 12a and a second lower electrode 12b is smaller than a width $W_{822}$ of a gap 22 between a second lower electrode 12b and a third lower electrode 12c and a width $W_{823}$ of a gap 23 between a third lower electrode 12c and a first lower electrode 12a.

A width $W_{31}$ of the first column banks 31 is smaller than a width $W_{32}$ of the second column bank 32 and a width $W_{33}$ of the third column banks 33 in the structure of the present modification, similarly to the structure of Embodiment 1. Accordingly, the structure of the present modification achieves effects similar to Embodiment 1.

6. Other Modifications (Selection of Third Organic Light-Emitting Layer)

In the above embodiments etc., organic light-emitting layers having the smallest thickness correspond to the third organic light-emitting layers. However, the present disclosure should not be construed as being limited to this, and the third organic light-emitting layers can be selected in accordance with the following factors: viscosity of organic light-emitting material inks, lengths of ligaments of organic light-emitting material inks when ejected, and how organic light-emitting material inks are formed. Note that the term "ligament" here refers to a tail portion of a droplet of an organic light-emitting material ink that has a spherical portion and a tail portion between ejection and landing. These factors are described in the following.

Organic light-emitting layers made of organic light-emitting material inks with relatively high viscosity, among organic light-emitting material inks that are applied to regions between adjacent column banks when forming organic light-emitting layers, may be selected as the third organic light-emitting layers. When organic light-emitting material inks are held in regions between adjacent column banks and the amounts of organic light-emitting material inks that are applied to the regions are the same as one another, the lower the viscosity of an organic light-emitting material ink, the greater the widths of portions of the organic light-emitting material ink that extend onto the column banks. When an organic light-emitting material ink with relatively high viscosity is adopted as a material for the third organic light-emitting layers, the widths of portions of the organic light-emitting material ink that extend onto the column banks are small. This prevents occurrence of color mixture.

Further, organic light-emitting layers made of an organic light-emitting material ink whose ligament is relatively short among organic light-emitting material inks that are applied to regions between adjacent column banks when forming organic light-emitting layers may be selected as the third organic light-emitting layers. The longer the ligament of an organic light-emitting material ink ejected into regions between adjacent column banks, the more likely the organic light-emitting material ink is to accidentally land at positions other than desired positions. Forming a second column bank so as to be between an organic light-emitting material ink whose ligament is relatively long and another organic light-emitting material ink prevents these inks from contacting each other and prevents occurrence of color mixture.

Further, an organic light-emitting layer formed through vapor deposition of a low-molecular organic light-emitting material, instead of application of an ink, may be selected as the third organic light-emitting layer. The thickness of an organic light-emitting layer formed through vapor deposition is not affected by a difference in an application amount of an ink. Forming the first column bank so as to be between the first organic light-emitting layer and the second organic light-emitting layer that are adjacent to each other and allowing the first organic light-emitting material ink and the second organic light-emitting material ink to contact each other prevents the thickness of the first organic light-emitting layer and the thickness of the second organic light-emitting layer from differing from one another.

(Whether or not First Organic Light-Emitting Layer and Second Organic Light-Emitting Layer Contact Each Other)

In Embodiment 1 described above, the first organic light-emitting material ink applied to a region between the column banks and the second organic light-emitting material ink applied to another region that is adjacent in the first direction to the region where the first organic light-emitting material ink is applied are in contact with each other, but the first organic light-emitting layer and the second organic light-emitting layer that are consequently formed are separated from each other by a first column bank. However, the present disclosure should not be construed as being limited to this. When all of the first column banks, the second column banks, and the third column banks have relatively low liquid repellency, the first organic light-emitting layer and the second organic light-emitting layer that are consequently formed may extend onto the first column bank and contact each other.

(Characterizing Features of First Column Banks)

In the above embodiments etc., the first column banks have one or all of the following characterizing features: a smaller width than the second column banks, a lower height than the second column banks, and relatively low liquid repellency. However, the present disclosure should not be construed as being limited to this, and the first column banks may possess two of the three characterizing features.

SUMMARY

A display panel pertaining to one aspect of the present disclosure includes: a substrate; a first lower electrode, a second lower electrode, and a third lower electrode that are disposed on the substrate and are spaced away from one another in a first direction; a first column bank disposed above the substrate and between the first lower electrode and the second lower electrode, and extending in a second direction intersecting the first direction; a second column bank disposed above the substrate and between the second lower electrode, and the third lower electrode and extending in the second direction; a first organic light-emitting layer disposed above the first lower electrode, a second organic light-emitting layer disposed above the second lower electrode, and a third organic light-emitting layer disposed above the third lower electrode; and an upper electrode disposed above the first organic light-emitting layer, the second organic light-emitting layer, the third organic light-emitting layer, the first column bank, and the second column bank. In the display panel, the first organic light-emitting layer contains a first organic light-emitting material, the second organic light-emitting layer contains a second organic light-emitting material that has the same light-emission color as the first organic light-emitting material, the third organic light-emitting layer contains a third organic light-emitting material that has a light-emission color that is different from the first organic light-emitting material, ink-separating capability of the first column bank for separating a first ink and a second ink is lower than ink-separating capability of the second column bank for separating the second ink and a third ink, the first ink containing the first organic light-emitting material and applied above the first lower electrode to form the first organic light-emitting layer, the second ink containing the second organic light-emitting material and applied above the second lower electrode to form the second organic light-emitting layer, and the third ink containing the third organic light-emitting material and applied above the third lower electrode to form the third organic light-emitting layer, and the first column bank has a lower height than the second column bank.

According to the display panel pertaining to one aspect of the present disclosure, the ink-separating capability of the first column bank is lower than the ink-separating capability of the second column bank.

In other words, when the first ink, the second ink, and the third ink are applied, the possibility of the second ink and the third ink spreading onto the second column bank is lower than the possibility of the first ink and the second ink spreading onto the first column bank. That is, the possibility that the second ink and the third ink contact each other is lower than the possibility that the first ink and the second ink contact each other. Here, the second organic light-emitting material in the second ink and the third organic light-emitting material in the third ink each have a different light-emission color. Contact of the second ink and the third ink thus causes color mixture. Meanwhile, the first organic light-emitting material in the first ink and the second organic light-emitting material in the second ink have the same light-emission color. Contact of the first ink and the second ink thus does not cause color mixture. Accordingly, this structure prevents occurrence of color mixture in the entire display panel.

Further, even when an amount of the first ink and an amount of the second ink at regions sandwiching the first column bank accidentally differ from each other, the first ink and the second ink are likely to spread onto the first column bank and contact each other. This prevents thicknesses of the first organic light-emitting layer and the second organic light-emitting layer that are consequently formed from differing from each other.

Because the first column bank has a lower height than the second column bank, the first ink and the second ink that are applied to the regions sandwiching the first column bank are likely to spread onto the first column bank and contact each other. In other words, the ink-separating capability of the first column bank is lower than the ink-separating capability of the second column bank. Adjustment of ink-separating capability is achieved by changing heights of the column banks, without increasing the widths of the column banks. Accordingly, even when the display panel does not have a small opening ratio, occurrence of color mixture is prevented and thicknesses of organic light-emitting layers are prevented from differing from one another.

A display panel pertaining to one aspect of the present disclosure includes: a substrate; a first lower electrode, a second lower electrode, and a third lower electrode that are disposed on the substrate and are spaced away from one another in a first direction; a first column bank disposed above the substrate and between the first lower electrode and the second lower electrode, and extending in a second direction intersecting the first direction; a second column bank disposed above the substrate and between the second lower electrode, and the third lower electrode and extending in the second direction; a first organic light-emitting layer disposed above the first lower electrode, a second organic light-emitting layer disposed above the second lower electrode, and a third organic light-emitting layer disposed above the third lower electrode; and an upper electrode disposed above the first organic light-emitting layer, the second organic light-emitting layer, the third organic light-emitting layer, the first column bank, and the second column bank. In the display panel, the first organic light-emitting layer contains a first organic light-emitting material, the second organic light-emitting layer contains a second organic light-emitting material that has the same light-emission color as the first organic light-emitting material, the third organic light-emitting layer contains a third organic light-emitting material that has a light-emission color that is different from the first organic light-emitting material, ink-separating capability of the first column bank for separating a first ink and a second ink is lower than ink-separating capability of the second column bank for separating the second ink and a third ink, the first ink containing the first organic light-emitting material and applied above the first lower electrode to form the first organic light-emitting layer, the second ink containing the second organic light-emitting material and applied above the second lower electrode to form the second organic light-emitting layer, and the third ink containing the third organic light-emitting material and applied above the third lower electrode to form the third organic light-emitting layer, and liquid repellency of the first column bank against the first ink and the second ink is lower than liquid repellency of the second column bank against the second ink and the third ink.

Because the first column bank has lower liquid repellency than the second column bank, the first ink and the second ink that are applied to the regions sandwiching the first column bank are likely to spread onto the first column bank and contact each other. In other words, the ink-separating capability of the first column bank is lower than the ink-separating capability of the second column bank. Adjustment of ink-separating capability is achieved by changing liquid repellency of the column banks, without increasing the widths of the column banks. Accordingly, even when the display panel does not have a small opening ratio, occurrence of color mixture is prevented and thicknesses of organic light-emitting layers are prevented from differing from one another.

A method of manufacturing a display panel pertaining to one aspect of the present disclosure a method of manufacturing a display panel pertaining to another aspect of the present disclosure includes: preparing a substrate; forming, on the substrate, a first lower electrode, a second lower electrode, and a third lower electrode that are spaced away from one another in a first direction; forming a first column bank between the first lower electrode and the second lower electrode, and a second column bank between the second lower electrode and the third lower electrode; applying a first ink containing a first organic light-emitting material above the first lower electrode, a second ink containing a second organic light-emitting material above the second lower electrode, and a third ink containing a third organic light-emitting material above the third lower electrode; forming a first organic light-emitting layer by drying the first ink, forming a second organic light-emitting layer by drying the second ink, and forming a third organic light-emitting layer by drying the third ink; and forming an upper electrode covering the first organic light-emitting layer, the second organic light-emitting layer, the third organic light-emitting layer, the first column bank, and the second column bank. In the method, the second organic light-emitting material has the same light-emission color as the light-emission color of the first organic light-emitting material, and the third organic light-emitting material has a light-emission color that is different from the light-emission color of the first organic light-emitting material.

In this structure, the first organic light-emitting material included in the first ink and the second organic light-emitting material included in the second ink have the same light-emission color. Accordingly, occurrence of color mixture is prevented even when the first ink and the second ink, applied through an ink-jet process, do not land at desired positions.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. A method of manufacturing a display panel, comprising:
   preparing a substrate;
   forming, on the substrate, a first lower electrode, a second lower electrode, and a third lower electrode that are spaced away from one another in a first direction;
   forming a first column bank between the first lower electrode and the second lower electrode, and a second column bank between the second lower electrode and the third lower electrode;
   applying a first ink containing a first organic light-emitting material above the first lower electrode, a second ink containing a second organic light-emitting material above the second lower electrode, and a third ink containing a third organic light-emitting material above the third lower electrode;
   forming a first organic light-emitting layer by drying the first ink, forming a second organic light-emitting layer by drying the second ink, and forming a third organic light-emitting layer by drying the third ink; and
   forming an upper electrode covering the first organic light-emitting layer, the second organic light-emitting layer, the third organic light-emitting layer, the first column bank, and the second column bank, wherein
   the second organic light-emitting material has the same light-emission color as a light-emission color of the first organic light-emitting material, and
   the third organic light-emitting material has a light-emission color that is different from the light-emission color of the first organic light-emitting material,
   wherein when applying the first ink, the second ink, and the third ink, the first ink and the second ink each spread onto the first column bank and contact each other.

2. The method of claim 1, wherein
a height of the first column bank is lower than a height of the second column bank.

3. The method of claim 1, wherein
liquid repellency of the first column bank against the first ink and the second ink is lower than liquid repellency of the second column bank against the second ink and the third ink.

4. The method of claim 1, wherein
a width of the first column bank in the first direction is smaller than a width of the second column bank in the first direction.

5. The method of claim 1, wherein
a volume of the third ink applied per unit area is smaller than a volume of the first ink applied per unit area and a volume of the second ink applied per unit area.

6. The method of claim 1, wherein
viscosity of the third ink is higher than viscosity of the first ink and viscosity of the second ink.

7. The method of claim 1, wherein
applying of the first ink, the second ink, and the third ink is performed through ejecting the first ink, the second ink, and the third ink from an ink-jet device, and
upon ejection from the ink-jet device, a ligament of the third ink is shorter than a ligament of the first ink and a ligament of the second ink.

8. A display panel comprising:
a substrate;
a first lower electrode, a second lower electrode, and a third lower electrode that are disposed on the substrate and are spaced away from one another in a first direction;
a first column bank disposed above the substrate and between the first lower electrode and the second lower electrode, and extending in a second direction intersecting the first direction;
a second column bank disposed above the substrate and between the second lower electrode, and the third lower electrode and extending in the second direction;
a first organic light-emitting layer disposed above the first lower electrode, a second organic light-emitting layer disposed above the second lower electrode, and a third organic light-emitting layer disposed above the third lower electrode; and
an upper electrode disposed above the first organic light-emitting layer, the second organic light-emitting layer, the third organic light-emitting layer, the first column bank, and the second column bank, wherein the first organic light-emitting layer contains a first organic light-emitting material, the second organic light-emitting layer contains a second organic light-emitting material that has the same light-emission color as the first organic light-emitting material, the third organic light-emitting layer contains a third organic light-emitting material that has a light-emission color that is different from the first organic light-emitting material, ink-separating capability of the first column bank for separating a first ink and a second ink is lower than ink-separating capability of the second column bank for separating the second ink and a third ink, the first ink containing the first organic light-emitting material and applied above the first lower electrode to form the first organic light-emitting layer, the second ink containing the second organic light-emitting material and applied above the second lower electrode to form the second organic light-emitting layer, and the third ink containing the third organic light-emitting material and applied above the third lower electrode to form the third organic light-emitting layer, and the first column bank has a lower height than the second column bank.

9. The display panel of claim 8, wherein the first organic light-emitting layer and the second organic light-emitting layer each extend onto the first column bank and are in contact with each other.

10. The display panel of claim 8, wherein a thickness of the first organic light-emitting layer and a thickness of the second organic light-emitting layer are greater than a thickness of the third organic light-emitting layer.

11. The display panel of claim 8, wherein at least one of the first organic light-emitting layer, the second light-emitting layer, and the third organic light-emitting layer has a width in the first direction that differs from widths in the first direction of the rest of the first organic light-emitting layer, the second light-emitting layer, and the third organic light-emitting layer.

12. The display panel of claim 11, wherein an organic light-emitting layer that has the shortest luminance half-life among the first organic light-emitting layer, the second organic light-emitting layer, and the third organic light-emitting layer has the greatest width in the first direction among the first organic light-emitting layer, the second organic light-emitting layer, and the third organic light-emitting layer.

13. The display panel of claim 11, wherein an organic light-emitting layer that has the longest luminance half-life among the first organic light-emitting layer, the second organic light-emitting layer, and the third organic light-emitting layer has the smallest width in the first direction among the first organic light-emitting layer, the second organic light-emitting layer, and the third organic light-emitting layer.

14. A display panel comprising:

a substrate;

a first lower electrode, a second lower electrode, and a third lower electrode that are disposed on the substrate and are spaced away from one another in a first direction;

a first column bank disposed above the substrate and between the first lower electrode and the second lower electrode, and extending in a second direction intersecting the first direction;

a second column bank disposed above the substrate and between the second lower electrode, and the third lower electrode and extending in the second direction;

a first organic light-emitting layer disposed above the first lower electrode, a second organic light-emitting layer disposed above the second lower electrode, and a third organic light-emitting layer disposed above the third lower electrode; and an upper electrode disposed above the first organic light-emitting layer, the second organic light-emitting layer, the third organic light-emitting layer, the first column bank, and the second column bank, wherein the first organic light-emitting layer contains a first organic light-emitting material, the second organic light-emitting layer contains a second organic light-emitting material that has the same light-emission color as the first organic light-emitting material, the third organic light-emitting layer contains a third organic light-emitting material that has a light-emission color that is different from the first organic light-emitting material, ink-separating capability of the first column bank for separating a first ink and a second ink is lower than ink-separating capability of the second column bank for separating the second ink and a third ink, the first ink containing the first organic light-emitting material and applied above the first lower electrode to form the first organic light-emitting layer, the second ink containing the second organic light-emitting material and applied above the second lower electrode to form the second organic light-emitting layer, and the third ink containing the third organic light-emitting material and applied above the third lower electrode to form the third organic light-emitting layer, and liquid repellency of the first column bank against the first ink and the second ink is lower than liquid repellency of the second column bank against the second ink and the third ink.

\* \* \* \* \*